US012596234B2

(12) United States Patent
Shimada et al.

(10) Patent No.: US 12,596,234 B2
(45) Date of Patent: Apr. 7, 2026

(54) OPTICAL MODULE AND OPTICAL CONNECTOR CABLE

(71) Applicant: SUMITOMO ELECTRIC INDUSTRIES, LTD., Osaka (JP)

(72) Inventors: Kensaku Shimada, Osaka (JP); Takeshi Inoue, Osaka (JP); Takuya Ishida, Osaka (JP); Tatsuhiko Naito, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 314 days.

(21) Appl. No.: 18/580,069

(22) PCT Filed: Jul. 5, 2022

(86) PCT No.: PCT/JP2022/026762
§ 371 (c)(1),
(2) Date: Jan. 17, 2024

(87) PCT Pub. No.: WO2023/013350
PCT Pub. Date: Feb. 9, 2023

(65) Prior Publication Data
US 2025/0085493 A1 Mar. 13, 2025

(30) Foreign Application Priority Data
Aug. 5, 2021 (JP) ................................. 2021-128994

(51) Int. Cl.
*G02B 6/42* (2006.01)
*H05K 1/02* (2006.01)
(52) U.S. Cl.
CPC ........... *G02B 6/428* (2013.01); *G02B 6/4201* (2013.01); *H05K 1/0274* (2013.01); *G02B 6/4204* (2013.01); *G02B 6/4244* (2013.01)

(58) Field of Classification Search
CPC ........ G02B 6/42; G02B 6/4201; G02B 6/428; G02B 6/4281; G02B 6/43; H05K 1/0274
See application file for complete search history.

(56) References Cited

U.S. PATENT DOCUMENTS 4,537,469 A * 8/1985 Kircher ..................... B64C 1/06
385/13
6,526,204 B1 2/2003 Sherrer et al.
(Continued)

FOREIGN PATENT DOCUMENTS

CN 104133271 A 11/2014
GB 1385526 A * 2/1975
(Continued)

*Primary Examiner* — Michael Stahl
(74) *Attorney, Agent, or Firm* — OLIFF PLC

(57) ABSTRACT

An optical module includes a substrate, an optical element, and an optical coupling module. The substrate includes a glass cloth constituted of glass threads serving as weft and warp. An outer edge of the substrate has a rectangular shape defined by a pair of first side surfaces in a predetermined direction and a pair of second side surfaces in a direction orthogonal to the predetermined direction. The weft is inclined with respect to the first side surfaces and the second side surfaces. The warp is inclined with respect to the first side surfaces and the second side surfaces. A cavity is formed in the substrate. At least a part of the optical coupling module is accommodated in the cavity. A side surface of the cavity includes an inclined region inclined with respect to an extension direction of the weft and an extension direction of the warp.

15 Claims, 17 Drawing Sheets

(56) References Cited

U.S. PATENT DOCUMENTS

| | | | |
|---|---|---|---|
| 2002/0127379 A1 | 9/2002 | Suzuki et al. | |
| 2005/0063637 A1* | 3/2005 | Mershon | G02B 6/43 |
| | | | 385/15 |
| 2006/0223307 A1 | 10/2006 | Gotoh et al. | |
| 2007/0154132 A1* | 7/2007 | Mates | G02B 6/43 |
| | | | 385/14 |
| 2013/0270427 A1 | 10/2013 | Hsiao et al. | |
| 2014/0008679 A1* | 1/2014 | Deguchi | H10F 39/804 |
| | | | 257/432 |
| 2014/0140657 A1 | 5/2014 | Shiraishi | |
| 2019/0129106 A1 | 5/2019 | Inoue et al. | |
| 2019/0229807 A1* | 7/2019 | Somaduroff | G02B 6/02038 |
| 2019/0317284 A1* | 10/2019 | Matsuoka | G02B 6/4214 |
| 2020/0018911 A1 | 1/2020 | Mori | |
| 2022/0091339 A1 | 3/2022 | Hirabayashi et al. | |
| 2024/0319451 A1* | 9/2024 | Shimada | G02B 6/4249 |

FOREIGN PATENT DOCUMENTS

| | | | |
|---|---|---|---|
| JP | H04-341804 A | | 11/1992 |
| JP | 5-212697 | * | 8/1993 |
| JP | 2002-208763 A | | 7/2002 |
| JP | 2004-288795 A | | 10/2004 |
| JP | 2006-130632 A | | 5/2006 |
| JP | 2008-290347 A | | 12/2008 |
| JP | 2010-122311 A | | 6/2010 |
| JP | 2010-122312 A | | 6/2010 |
| JP | 2010-271444 A | | 12/2010 |
| JP | 2014-102399 A | | 6/2014 |
| JP | 2015-222312 A | | 12/2015 |
| JP | 2017-110104 A | | 6/2017 |
| JP | 2019-082508 A | | 5/2019 |
| JP | 2020-008813 A | | 1/2020 |
| WO | 2020/149278 A1 | | 7/2020 |

* cited by examiner

OPTICAL MODULE AND OPTICAL CONNECTOR CABLE

TECHNICAL FIELD

The present disclosure relates to an optical module and an optical connector cable. The present application claims the priority based on Japanese Patent Application No. 2021-128994, filed on Aug. 5, 2021, the entire content described in the application is incorporated herein by reference.

BACKGROUND ART

Patent Literature 1 discloses an optical component as an example of an optical module including a substrate having an optical element mounted therein, and an optical coupling module optically coupled to the optical element. In the optical module, light emitted from optical fibers held by the optical coupling module is incident on the optical element mounted on the substrate via the optical coupling module.

CITATION LIST

Patent Literature

[Patent Literature 1] Japanese Unexamined Patent Publication No. 2019-082508

SUMMARY OF INVENTION

An optical module of the present disclosure includes a substrate, an optical element, and an optical coupling module. The substrate internally includes a glass cloth constituted of glass threads serving as weft and warp. An outer edge of the substrate when viewed in a thickness direction has a rectangular shape defined by a pair of first side surfaces in a predetermined direction and a pair of second side surfaces in a direction orthogonal to the predetermined direction. The optical element is mounted on the substrate. The optical coupling module is configured to be optically coupled to the optical element. The weft is inclined with respect to the first side surfaces and the second side surfaces when viewed in the thickness direction of the substrate. The warp is inclined with respect to the first side surfaces and the second side surfaces when viewed in the thickness direction of the substrate. A cavity recessed from a first main surface of the substrate toward a second main surface of the substrate so as to include a bottom portion is formed in the substrate. At least a part of the optical coupling module is accommodated in the cavity. A side surface of the cavity includes an inclined region inclined with respect to an extension direction of the weft and an extension direction of the warp when viewed in the thickness direction of the substrate.

An optical module of the present disclosure includes a substrate, an optical element, and an optical coupling module. The substrate internally includes a glass cloth constituted of glass threads serving as weft and warp. An outer edge of the substrate when viewed in a thickness direction has a rectangular shape defined by a pair of first side surfaces in a predetermined direction and a pair of second side surfaces in a direction orthogonal to the predetermined direction. The optical element is mounted on the substrate. The optical coupling module is configured to be optically coupled to the optical element. The weft extends along the first side surfaces when viewed in the thickness direction of the substrate. The warp extends along the second side surfaces when viewed in the thickness direction of the substrate. A cavity recessed from a first main surface of the substrate toward a second main surface of the substrate so as to include a bottom portion is formed in the substrate. At least a part of the optical coupling module is accommodated in the cavity. A side surface of the cavity includes an inclined region inclined with respect to an extension direction of the weft and an extension direction of the warp when viewed in the thickness direction of the substrate.

DESCRIPTION OF EMBODIMENTS

Figure 1:
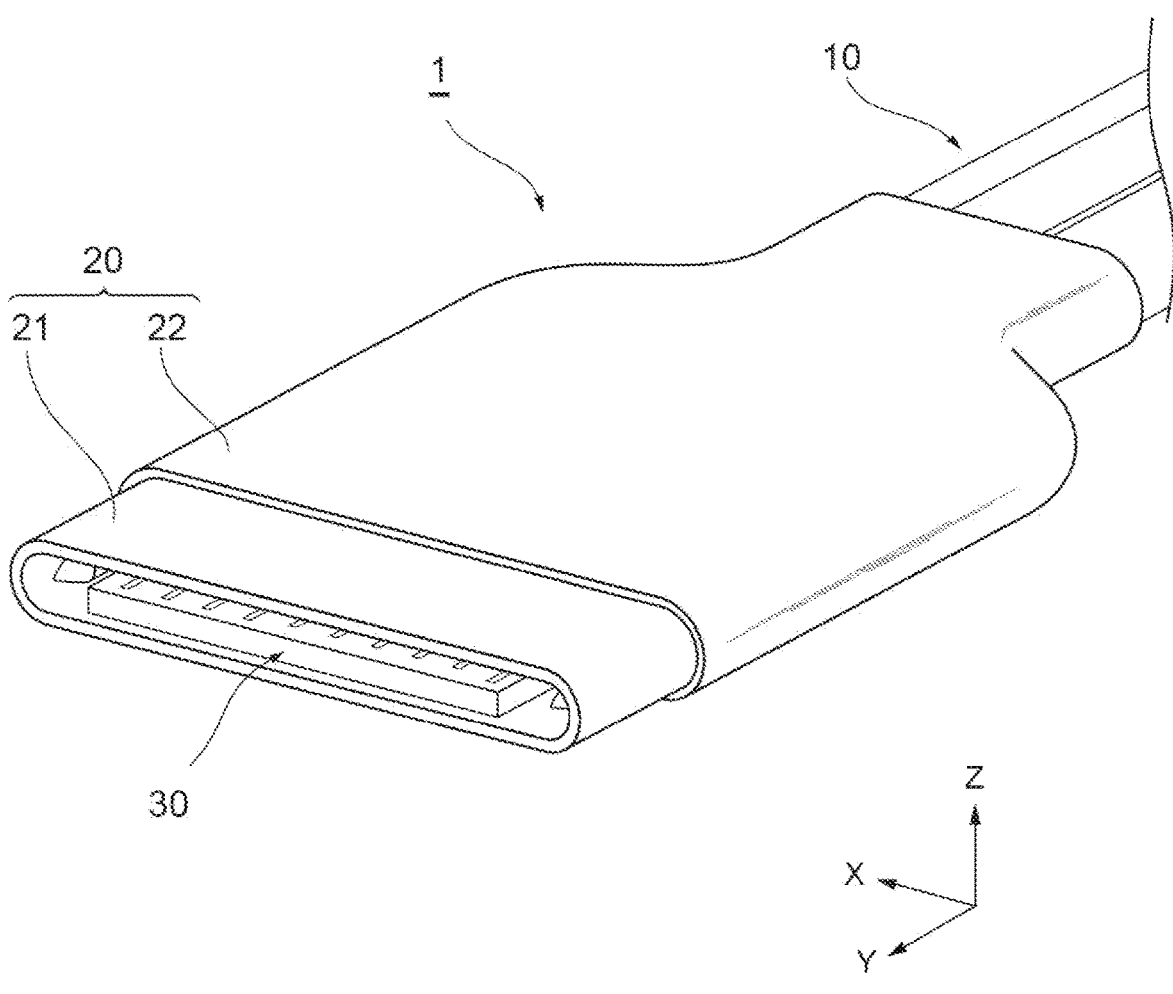
FIG. 1 is a perspective view illustrating an end portion of an optical connector cable according to an embodiment.

Problem to be Solved by Present Disclosure

The optical module disclosed in Patent Literature 1 has a structure in which an optical coupling module is mounted in a substrate. For this reason, the thickness of the entire optical module increases by the amount of thicknesses of the substrate and the optical coupling module. Hence, in order to make the optical module thinner, a cavity recessed from one main surface of the substrate toward the other main surface may be formed, and at least a part of the optical coupling module may be accommodated inside the cavity.

However, when a cavity is formed in a substrate, there is concern that a part of a glass cloth provided inside the substrate will protrude into the cavity from a side surface of the cavity, which may obstruct mounting of the optical coupling module. In addition, when glass threads protruding from the side surface of the cavity are present on an optical path (for example, between a lens provided in the optical coupling module and an optical element mounted in the substrate), there is concern that transmission of light will be disturbed. Hence, it is desired to develop an optical module in which mountability of an optical coupling module can be improved and transmission of light can be more adequately performed.

An object of the present disclosure is to provide an optical module and an optical connector cable, in which mountability of an optical coupling module can be improved and transmission of light can be adequately performed.

Effects of Present Disclosure

According to the present disclosure, it is possible to improve mountability of an optical coupling module and more adequately perform transmission of light.

Description of Embodiments of Present Disclosure

First, details of an embodiment of the present disclosure will be listed and described. An optical module according to one embodiment includes a substrate, an optical element, and an optical coupling module. The substrate internally includes a glass cloth constituted of glass threads serving as weft and warp. An outer edge of the substrate when viewed in a thickness direction has a rectangular shape defined by a pair of first side surfaces in a predetermined direction and a pair of second side surfaces in a direction orthogonal to the predetermined direction. The optical element is mounted on the substrate. The optical coupling module is configured to be optically coupled to the optical element. The weft is inclined with respect to the first side surfaces and the second side surfaces when viewed in the thickness direction of the substrate. The warp is inclined with respect to the first side surfaces and the second side surfaces when viewed in the thickness direction of the substrate. A cavity recessed from a first main surface of the substrate toward a second main surface of the substrate so as to include a bottom portion is formed in the substrate. At least a part of the optical coupling module is accommodated in the cavity. A side surface of the cavity includes an inclined region inclined with respect to an extension direction of the weft and an extension direction of the warp when viewed in the thickness direction of the substrate.

In this optical module, the side surface of the cavity includes the inclined region. Since this inclined region is inclined with respect to the extension direction of the weft and the extension direction of the warp when viewed in the thickness direction of the substrate, the glass threads are unlikely to protrude into the cavity from the inclined region. Therefore, compared to when the entire area of the side surface of the cavity extends along the weft or the warp, the amount of glass threads protruding into the cavity from the side surface of the cavity can be reduced. Accordingly, obstruction to accommodation of the optical coupling module by the glass threads protruding into the cavity is curbed so that mountability of the optical coupling module is improved. Moreover, presence of the glass threads on an optical path (for example, between a lens provided in the optical coupling module and the optical element) is curbed, and transmission of light is more adequately performed.

As one embodiment, the cavity may include a first cavity, and a second cavity including a second bottom portion positioned closer to the second main surface than a first bottom portion of the first cavity and including a smaller opening area than the first cavity. Each of a side surface of the first cavity and a side surface of the second cavity may include the inclined region. The optical coupling module may include a lens optically coupled to the optical element. The lens may be accommodated in the second cavity. In this case, the entire region of the cavity can be made smaller by making only the cavity part mainly accommodating components such as a lens that is likely to become a component protruding from a lower surface of the optical coupling module be deep and making other parts be shallower than the cavity part. As a result, the strength of the substrate can be maintained even by a constitution in which a cavity is provided in the substrate.

An optical module according to one embodiment includes a substrate, an optical element, and an optical coupling module. The substrate internally includes a glass cloth constituted of glass threads serving as weft and warp. An outer edge when viewed in a thickness direction of the substrate has a rectangular shape defined by a pair of first side surfaces in a predetermined direction and a pair of second side surfaces in a direction orthogonal to the predetermined direction. The optical element is mounted on the substrate. The optical coupling module is configured to be optically coupled to the optical element. The weft extends along the first side surfaces when viewed in the thickness direction of the substrate. The warp extends along the second side surfaces when viewed in the thickness direction of the substrate. A cavity recessed from a first main surface of the substrate toward a second main surface of the substrate so as to include a bottom portion is formed in the substrate. At least a part of the optical coupling module is accommodated in the cavity. A side surface of the cavity includes an inclined region inclined with respect to an extension direction of the weft and an extension direction of the warp when viewed in the thickness direction of the substrate.

In this optical module, the side surface of the cavity includes the inclined region. Since this inclined region is inclined with respect to the extension direction of the weft and the extension direction of the warp of the glass threads when viewed in the thickness direction of the substrate, the glass threads are unlikely to protrude into the cavity from the inclined region. Therefore, compared to when the entire area of the side surface of the cavity extends along the weft or the warp, the amount of glass threads protruding into the cavity from the side surface of the cavity can be reduced. Accordingly, obstruction to accommodation of the optical coupling module by the glass threads protruding into the cavity is curbed so that mountability of the optical coupling module is improved. Moreover, presence of the glass threads on an optical path is curbed, and transmission of light is more adequately performed.

As one embodiment, the cavity may include a first cavity, and a second cavity including a second bottom portion positioned closer to the second main surface than a first bottom portion of the first cavity and including a smaller opening area than the first cavity. A side surface of the second cavity may include the inclined region. The optical coupling module may include a lens optically coupled to the optical element. The lens may be accommodated in the second cavity. In this case, the entire region of the cavity can be made smaller by making only the cavity part mainly accommodating components such as a lens that is likely to become a component protruding from a lower surface of the optical coupling module be deep and making other parts be shallower than the cavity part. As a result, the strength of the substrate can be maintained even by a constitution in which a cavity is provided in the substrate.

As one embodiment, the inclined region may be a curved surface bent when viewed in the thickness direction of the substrate. An outer edge of the cavity when viewed in the thickness direction of the substrate may have an oval shape or a fan shape defined by the side surface of the cavity. In this case, the cavity having the side surface including the inclined region can be easily formed by a simple constitution.

As one embodiment, an outer edge of the cavity when viewed in the thickness direction of the substrate may have a rhombic shape or a triangular shape defined by the side surface of the cavity. In this case, the cavity having the side surface including the inclined region can be easily formed by a simple constitution.

As one embodiment, an angle formed by the inclined region and the extension direction of the weft when viewed in the thickness direction of the substrate may be equal to or more than 10° and equal to or less than 80°. An angle formed by the inclined region and the extension direction of the warp when viewed in the thickness direction of the substrate may be equal to or more than 10° and equal to or less than 80°. In this case, the glass threads can be more reliably prevented from protruding into the cavity from the inclined region. For this reason, mountability of the optical coupling module is further improved, and transmission of light is even more adequately performed.

As one embodiment, the optical coupling module may include a holding portion for holding end portions of optical fibers optically coupled to the optical element via the optical coupling module. In this case, since the end portions of the optical fibers are adequately held by the holding portion of the optical coupling module, optical coupling between the optical element and the optical fibers can be more accurately performed.

As one embodiment, a penetration hole penetrating the bottom portion to the second main surface may be formed in the cavity. The optical element may be mounted on the second main surface so as to overlap the penetration hole when viewed from above the second main surface. In this case, the optical coupling module and the optical element mounted on the second main surface of the substrate can be optically coupled through a simple constitution such as a penetration hole.

An optical connector cable according to one embodiment includes any of the optical modules described above, and at least one optical fiber cable. The optical fiber cable includes an optical fiber. The optical fiber cable is attached to the optical module such that the optical fiber is optically coupled to the optical element via the optical coupling module. In this optical connector cable, similarly to the optical module described above, mountability of the optical coupling module can be improved, and transmission of light can be adequately performed.

Details of Embodiments of Present Disclosure

Specific examples of an optical module and an optical connector cable according to the present disclosure will be described below with reference to the drawings. The present disclosure is not limited to these examples, and is indicated by the claims, and it is intended to include all the changes within meaning and a range equivalent to the claims. The same reference signs will be applied to the same elements in description of the drawings, and the repeated description thereof will be omitted.

First Embodiment

Figure 2:
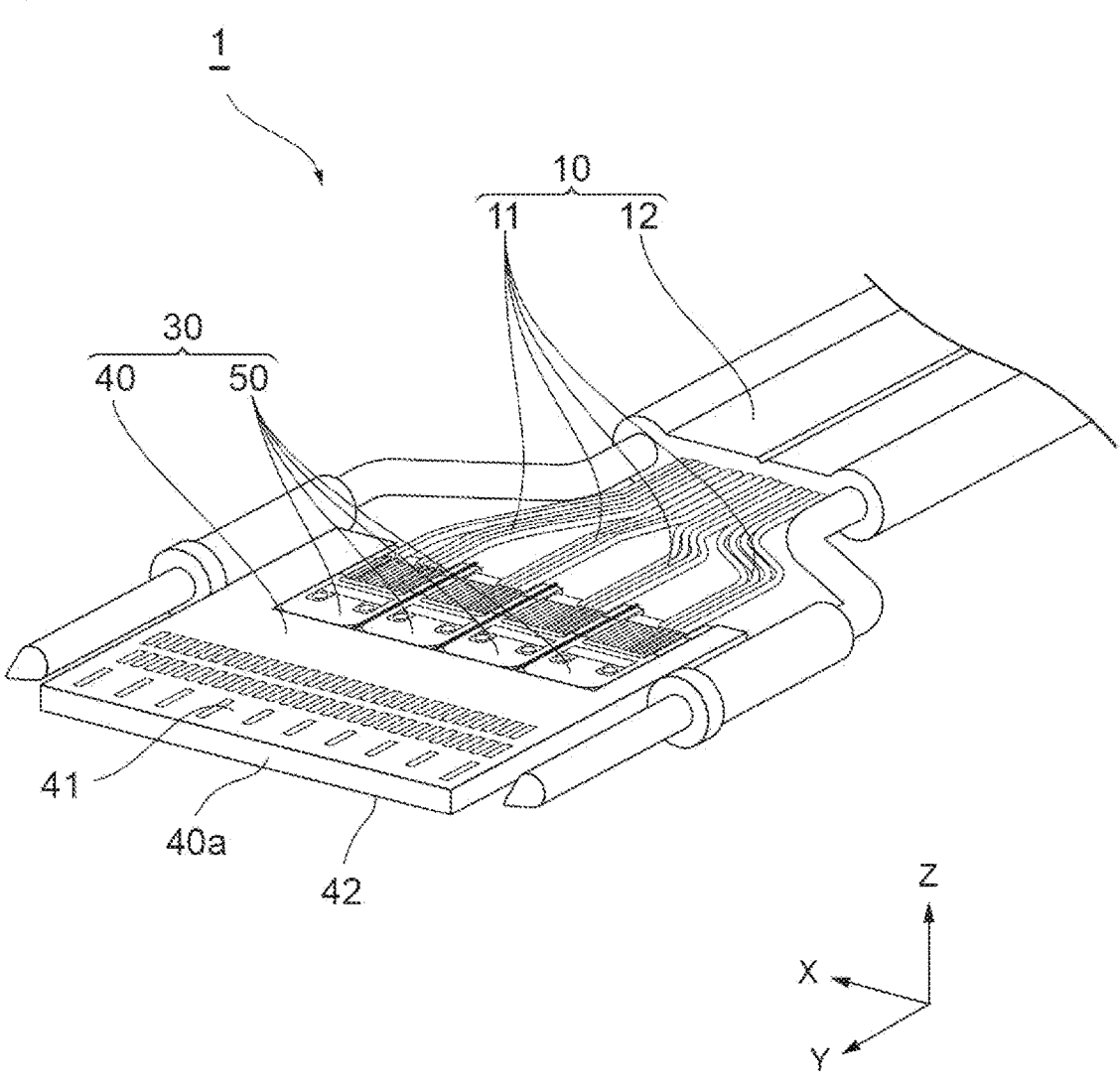
FIG. 2 is a perspective view illustrating the end portion of the optical connector cable from which a protective member is removed.

With reference to FIGS. 1 and 2, an optical connector cable 1 according to an embodiment will be described. FIG. 1 is a perspective view illustrating an end portion of the optical connector cable 1 according to the embodiment. FIG. 2 is a perspective view illustrating the end portion of the optical connector cable 1 from which a protective member 20 is removed. Hereinafter, for the sake of description, a width direction of the end portion of the optical connector cable 1 will be regarded as a direction X, an extension direction of the end portion will be regarded as a direction Y, and a thickness direction of the end portion will be regarded as a direction Z. In the present embodiment, the direction X, the direction Y, and the direction Z are orthogonal to each other.

For example, the optical connector cable 1 is a cable used for transmitting and receiving optical signals between devices. As illustrated in FIGS. 1 and 2, the optical connector cable 1 includes an optical fiber cable 10, the protective member 20, and an optical module 30. In FIGS. 1 and 2, one end of the optical fiber cable 10 is illustrated. The other end of the optical fiber cable 10 may also have a similar constitution.

As illustrated in FIG. 2, the optical fiber cable 10 has a plurality of optical fibers 11 and a cable sheath 12. Each of the optical fibers 11 is a member for transmitting optical signals. A great part of each of the optical fibers 11 is accommodated inside the cable sheath 12. A tip part of each of the optical fibers 11 is exposed to the outside of the cable sheath 12. The plurality of optical fibers 11 are arranged in the direction X in a one-dimensional manner. Inside the cable sheath 12, all the optical fibers 11 are accommodated close to each other in a bundle. Meanwhile, outside the cable sheath 12, the plurality of optical fibers 11 branch into several (in the present embodiment, four to six) bundles, and an end portion of each of the bundles is held by one optical coupling module 50. For example, each of the optical fibers 11 has a glass fiber and a coating resin. For example, the glass fiber includes a core and a cladding surrounding the core. Each of the optical fibers 11 may be a single-mode optical fiber (SMF) or a multi-mode optical fiber (MMF).

As illustrated in FIG. 1, the protective member 20 is a member having a flat shape extending in the direction X and the direction Y. The optical module 30 is accommodated inside the protective member 20. The protective member 20 protects the optical module 30 from an external impact or the like. The protective member 20 has a laminated structure constituted of an inner layer 21 and an outer layer 22 covering the inner layer 21. For example, the inner layer 21 is formed of a metal. For example, the outer layer 22 is formed of a resin. At the tip of the optical connector cable 1, a part of the inner layer 21 is exposed from the outer layer 22. For example, the exposed part of the inner layer 21 is inserted into a socket provided in a device to which the optical connector cable 1 is connected.

Figure 3:
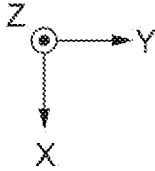
FIG. 3 is a plan view of an optical module viewed from above a first main surface of a substrate.
Figure 4:
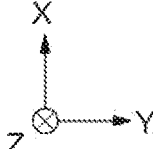
FIG. 4 is a plan view of the optical module viewed from above a second main surface of the substrate.
Figure 5:
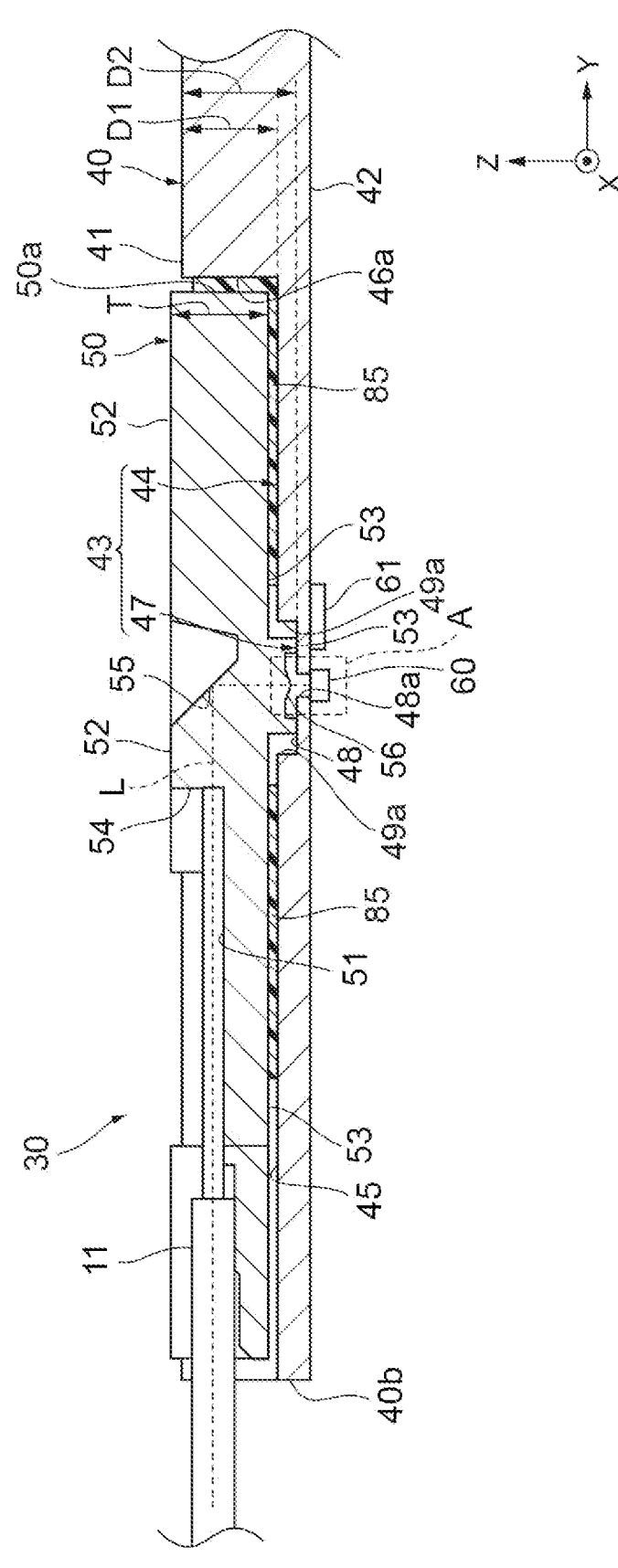
FIG. 5 is a cross-sectional view when the optical module is cut along line V-V indicated in FIG. 3.
Figure 6:
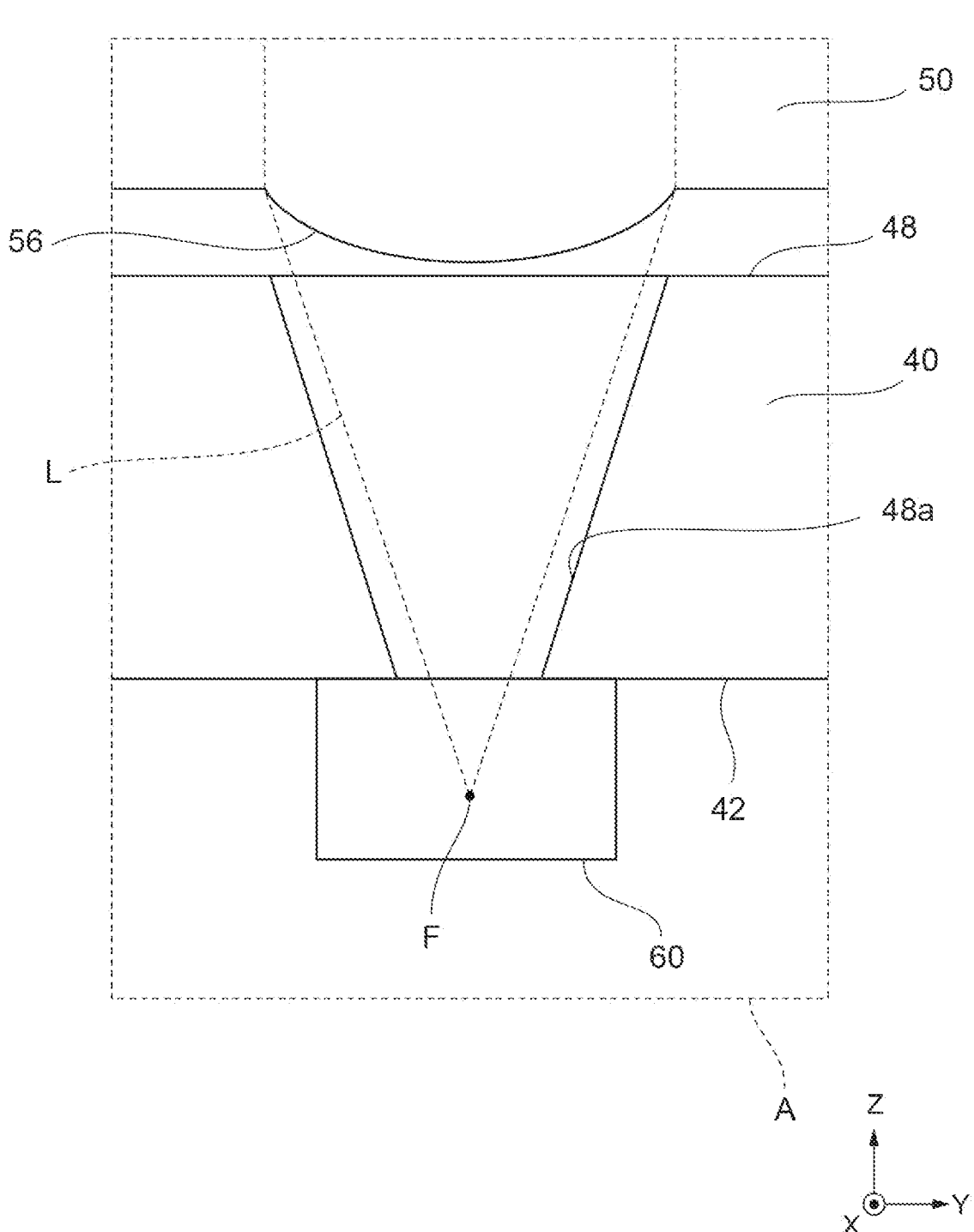
FIG. 6 is an enlarged view of a part surrounded by a dotted line A indicated in FIG. 5.

Next, the optical module 30 will be described with reference to FIGS. 3 to 6. FIG. 3 is a plan view of the optical module 30 viewed from above a first main surface 41 of a substrate 40. FIG. 4 is a plan view of the optical module 30 viewed from above a second main surface 42 of the substrate 40. FIG. 5 is a cross-sectional view when the optical module 30 is cut along line V-V indicated in FIG. 3. FIG. 6 is an enlarged view of a part surrounded by a dotted line A indicated in FIG. 5. The optical module 30 includes the substrate 40, a plurality of optical coupling modules 50, a plurality of optical elements 60, and a plurality of ICs 61.

The substrate 40 is a plate-shaped member on which various kinds of optical elements and electronic elements are mounted. The substrate 40 is a multilayer substrate constituted of a plurality of laminated resin layers or a single-layer substrate constituted of one resin layer. For example, the resin layer is formed of an epoxy resin, a polyimide resin, or a fluororesin. In the present embodiment, a thickness direction of the substrate 40 coincides with the direction Z. The substrate 40 has a pair of side surfaces 40*a* and 40*b* (first side surface) and a pair of side surfaces 40*c* and 40*d*. When viewed in the direction Z, the side surfaces 40*a* and 40*b* extend in the direction X (predetermined direction). When viewed in the direction Z, the side surfaces 40*c* and 40*d* extend in the direction Y (a direction orthogonal to the predetermined direction). When viewed in the direction Z, an outer edge of the substrate 40 has a rectangular shape defined by the pair of side surfaces 40*a* and 40*b* and the pair of side surfaces 40*c* and 40*d*. That is, the substrate 40 is a rectangular substrate. The substrate 40 has the first main surface 41 and the second main surface 42 facing each other in the direction Z. The thickness of the substrate 40 may be equal to or more than 0.2 mm and equal to or less than 0.8 mm.

The substrate 40 internally has at least one piece of glass cloth 70. The glass cloth 70 is woven fabric constituted of glass threads serving as warp and weft. In FIGS. 3 and 4, for the sake of convenience of description, only a part of the glass cloth 70 is illustrated. However, in the present embodiment, the glass cloth 70 is provided in the entire area of the substrate 40 when viewed in the direction Z. That is, when viewed in the direction Z, an outer edge of the glass cloth 70 coincides with the outer edge of the substrate 40. When the substrate 40 is a multilayer substrate, the glass cloth 70 may be provided in each of the plurality of resin layers constituting the substrate 40. In the present embodiment, the substrate 40 is a multilayer substrate, and a plurality of pieces of glass cloth 70 are laminated in the direction Z. A detailed constitution of the glass cloth 70 will be described below.

Various kinds of wirings (not illustrated) for electrically connecting the ICs 61 and other electronic elements are provided on an inward side of the substrate 40. In the following description, an end portion where the side surface 40*a* is positioned in the direction Y may be regarded as a tip of the optical module 30, and an end portion where the side surface 40*b* is positioned may be regarded as a base end of the optical module 30. In addition, a surface where the first main surface 41 is positioned in the direction Z may be regarded as an upper surface of the optical module 30, and a surface where the second main surface 42 is positioned may be regarded as a lower surface of the optical module 30.

As illustrated in FIG. 3, the first main surface 41 is a surface extending in the direction X and the direction Y and has a rectangular shape in a plan view. A plurality of patterns 41*a*, which are metal films, are provided in a region near the side surface 40*a* on the first main surface 41. For example, each of the patterns 41*a* may be connected to the ICs 61 via the wirings or the like inside the substrate 40. Meanwhile, the plurality of optical coupling modules 50 are placed side by side in the direction X in a region near the side surface 40*b* on the first main surface 41.

As illustrated in FIG. 4, the second main surface 42 is a surface extending in the direction X and the direction Y and has a rectangular shape in a plan view. The plurality of optical elements 60 and the plurality of ICs 61 are mounted in a region near the side surface 40*b* on the second main surface 42. In FIG. 4, for the sake of convenience of description, each of the optical elements 60 is indicated by a dotted line. For example, each of the optical elements 60 is a light receiving element such as a photodiode (PD). A light receiving surface of each of the optical elements 60 faces the optical coupling module 50. Each of the optical elements 60 overlaps one penetration hole 48*a* provided in the substrate 40 when viewed from above the second main surface 42 (in the direction Z). Accordingly, the optical element 60 can receive light from the optical coupling module 50 facing it with the substrate 40 interposed therebetween through the penetration hole 48*a*. In order to dispose the optical element 60 on the second main surface 42, the opening area of the penetration hole 48*a* on the second main surface 42 is smaller than the surface area of the surface facing the second main surface 42 in the optical element 60. Each of the ICs 61 is an integrated circuit for controlling operation of the optical element 60. For example, each of the ICs 61 may be connected to the optical element 60 via a wiring inside the substrate 40, a bonding wire, and the like. In the present embodiment, one IC 61 is connected to three optical elements 60. A high communication speed between the IC 61 and the optical element 60 can be maintained by disposing the IC 61 close to (for example, by disposing the IC 61 adjacent to) the optical element 60.

The optical coupling module 50 is a component for optically coupling the optical fibers 11 and the optical elements 60. The optical coupling module 50 is formed of a material allowing light emitted from the optical fibers 11 to be transmitted therethrough (for example, a glass or a light transmitting resin). As illustrated in FIG. 3, the optical coupling module 50 has substantially a rectangular shape when viewed in the direction Z. The optical coupling module 50 has a tip surface 50*a* and a pair of side surfaces 50*b*. The tip surface 50*a* is a surface extending in the direction X and the direction Z and connects the pair of side surfaces 50*b*. Each of the side surfaces 50*b* is a surface extending in the direction Y and the direction Z.

In addition, as illustrated in FIG. 5, the optical coupling module 50 has a groove portion 51, an upper surface 52, a lower surface 53, an abutting surface 54, a mirror 55, and a lens 56. The groove portion 51 is a V-groove extending in the direction Y (a groove having a V-shape in an XZ cross section) and is a holding portion for holding the end portions of the optical fibers 11. The groove portion 51 regulates positions of the optical fibers 11 with respect to the optical coupling module 50 and prevents positional displacement of the optical fibers 11 in the direction X. The end portions of the optical fibers 11 placed in the groove portion 51 are fixed to the groove portion 51, for example, using an adhesive. For example, the adhesive may be a UV curable adhesive or may be a light transmitting adhesive allowing light L emitted from the optical fibers 11 to be transmitted therethrough. The shape of the groove portion 51 is not limited to the V-groove. For example, the shape of the groove portion 51 may be a U-groove having a rounded bottom portion or may be a rectangular groove having a bottom surface extending in the direction X and the direction Y. The holding portion (in the present embodiment, the groove portion 51) for holding the end portions of the optical fibers 11 may not necessarily be provided in the optical coupling module 50. For example, the groove portion 51 may be provided in another component different from the optical coupling module 50. When the groove portion 51 is provided in another component, for example, the optical coupling module 50 may have a pair of projecting portions and another component provided with the groove portion 51 may have a pair of recessed portions. The optical coupling module 50 and another component may be connected by fitting each of the projecting portions of the optical coupling module 50 into each of the recessed portions of another component.

The upper surface 52 is a surface positioned in an upper portion of the optical coupling module 50 and extends in the direction X and the direction Y. The upper surface 52 is positioned closer to the tip surface 50*a* of the optical coupling module 50 with respect to the groove portion 51. The upper surface 52 is provided with a depression whose surface functions as the mirror 55. The lower surface 53 is a surface positioned in a lower portion of the optical coupling module 50 and extends in the direction X and the direction Y.

The abutting surface 54 is a surface which tip surfaces of the optical fibers 11 abut and extends in the direction X and the direction Z. The abutting surface 54 connects the end portion of the groove portion 51 and the end portion of the upper surface 52 in the direction Y. The light L emitted from the optical fibers 11 passes through the abutting surface 54 and is incident on the mirror 55. The abutting surface 54 and the tip surfaces of the optical fibers 11 may not come into direct contact with each other. For example, a light transmitting adhesive allowing the light L to be transmitted therethrough or a refractive index matching agent may be inserted between the abutting surface 54 and the tip surfaces of the optical fibers 11.

The mirror 55 is a member converting a propagation direction of the light L emitted from the optical fibers 11. The mirror 55 is provided in a manner of being inclined with respect to each of an XY plane and an XZ plane. The mirror 55 receives the light L emitted from the optical fibers 11 in the direction Y and reflects the light L in the direction Z toward the lens 56. An incidence optical axis and a reflection optical axis of the light L may form a right angle, for example. The light L reflected by the mirror 55 is incident on the optical element 60 through the lens 56 and the penetration hole 48*a*.

The lens 56 is a member optically coupled to the optical element 60. The lens 56 is provided in a part protruding toward the second main surface 42 in the direction Z in the optical coupling module 50. As illustrated in FIG. 6, the lens 56 faces the optical element 60 in the direction Z and has a surface curved in a projecting shape toward the optical element 60. A focus F of the lens 56 is positioned inside the optical element 60 with respect to the surface of the optical element 60. The lens 56 converges the light L reflected by the mirror 55 and causes it to be incident on the optical element 60. Various kinds of parameters of the lens 56 (for example, the surface shape, the size, the material, and the like of the lens 56) are optimized such that the focus F of the lens 56 is positioned inside the optical element 60.

Figure 7:
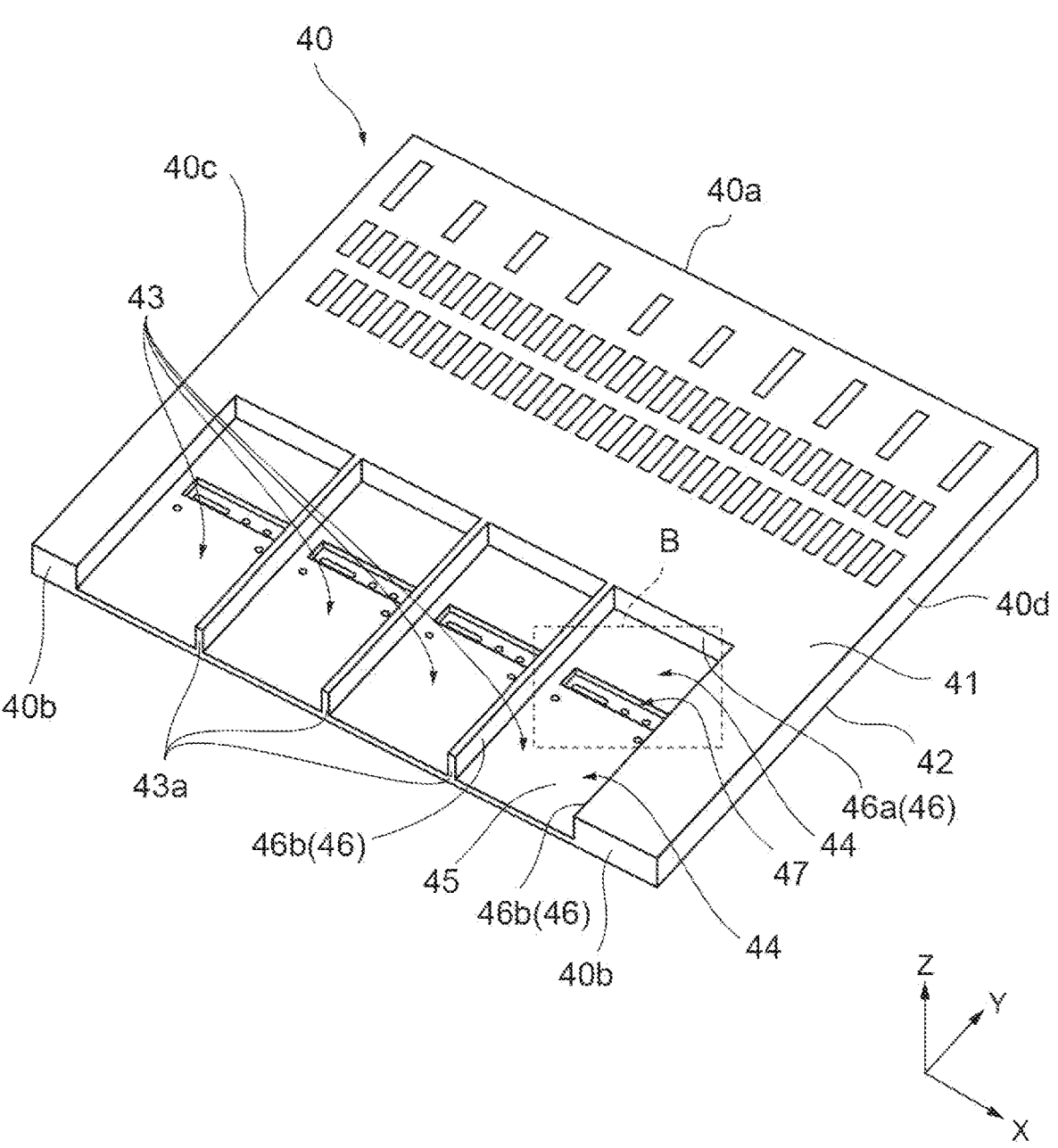
FIG. 7 is a perspective view illustrating the substrate applied to the optical module illustrated in FIG. 3.
Figure 8:
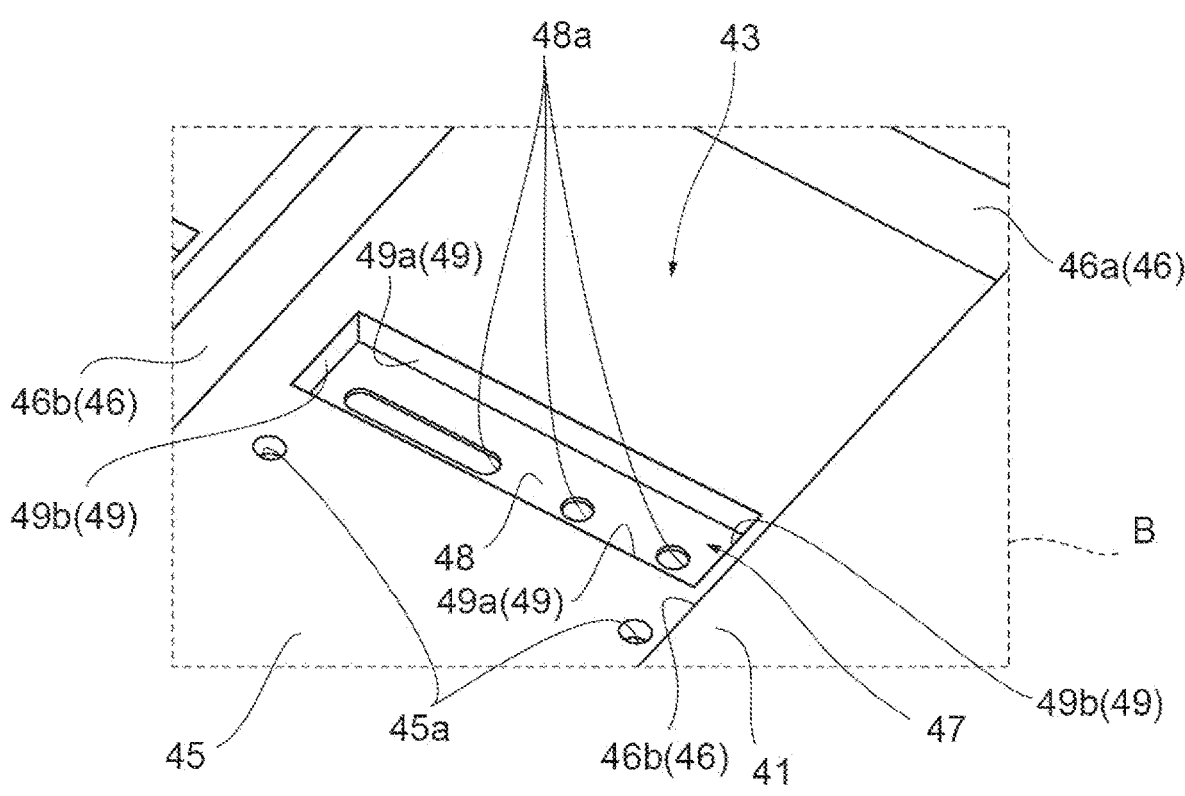
FIG. 8 is an enlarged view of a part surrounded by a dotted line B indicated in FIG. 7.
Figure 8:
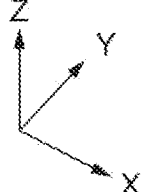

Next, with reference to FIGS. 7 and 8, a detailed constitution of the substrate 40 will be described. FIG. 7 is a perspective view illustrating the substrate 40. FIG. 8 is an enlarged view of a part surrounded by a dotted line B indicated in FIG. 7. In FIGS. 7 and 8, for the sake of convenience of description, illustration of the optical coupling modules 50 is omitted. As illustrated in FIG. 7, a plurality of cavities 43 are formed in the substrate 40. Each of the cavities 43 is a depression recessed from the first main surface 41 toward the second main surface 42. The optical coupling module 50 is accommodated inside each of the cavities 43. The plurality of cavities 43 are provided side by side in the direction X. The number of cavities 43 may be the same as or larger than the number of optical coupling modules 50 mounted in the substrate 40. In the present embodiment, the same number (four) of cavities 43 as the number of optical coupling modules 50 are formed. For example, each of the cavities 43 may be formed by counterboring. A beam portion 43*a* extending from the inside to the outside of the substrate 40 in the direction Y is provided between the cavities 43 adjacent to each other. The beam portion 43*a* has a shape rising from a first bottom portion 45 of each of the cavities 43 toward the first main surface 41 of the substrate 40.

Each of the cavities 43 includes a first cavity 44 and a second cavity 47. The first cavity 44 is a depression constituting most of the cavity 43 and has the first bottom portion 45 and side surfaces 46. The first bottom portion 45 is a part where the optical coupling module 50 is placed. In the present embodiment, it is a surface extending in the direction X and the direction Y. When viewed in the direction Z, an outer edge of the first bottom portion 45 has a rectangular shape having long sides in the direction Y. The first bottom portion 45 has a size allowing the optical coupling module 50 in its entirety to be placed. The optical coupling module 50 being placed on the first bottom portion 45 includes not only a case where the optical coupling module 50 is placed such that it comes into direct contact with the first bottom portion 45 but also a case where the optical coupling module 50 is placed on the first bottom portion 45 via a member such as an adhesive.

As illustrated in FIG. 8, the first bottom portion 45 has a pair of positioning holes 45*a*. Each of the positioning holes 45*a* is a hole penetrating the first bottom portion 45 to the second main surface 42 (refer to FIG. 4). The pair of positioning holes 45*a* function as a positioning mechanism for the optical coupling module 50 with respect to the cavity 43. For example, the pair of projecting portions corresponding to the pair of positioning holes 45*a* are provided in the optical coupling module 50, and the lens 56 (refer to FIG. 5) and the optical element 60 may be suitably optically coupled by placing the optical coupling module 50 such that each of the pair of projecting portions is fitted into each of the pair of positioning holes 45*a*. The number of positioning holes 45*a* may be one. However, positioning of the optical coupling module 50 can be more accurately performed by forming two or more positioning holes 45*a*. Each of the positioning holes 45*a* may not penetrate from the first bottom portion 45 to the second main surface 42, and it may be a non-penetration hole having a bottom surface.

A configuration of the positioning mechanism used for positioning the optical coupling module 50 is not limited to the positioning holes 45*a*. For example, the lens 56 of the optical coupling module 50 and the optical element 60 may be suitably optically coupled by providing a mark in each of the first bottom portion 45 and the optical coupling module 50 and placing the optical coupling module 50 at a position where the marks overlap each other. In order for the mark provided in the first bottom portion 45 to be able to be visually recognized through the optical coupling module 50, the material of the optical coupling module 50 may be a material allowing visible light to be transmitted therethrough (for example, a glass or a light transmitting resin).

The side surfaces 46 are surfaces connecting the first bottom portion 45 and the first main surface 41 to each other. The side surfaces 46 are surfaces rising from the outer edge of the first bottom portion 45 toward the first main surface 41 of the substrate 40. The side surfaces 46 define an outer edge of the first cavity 44 when viewed in the direction Z.

The side surfaces 46 may be parallel to the direction Z and may be inclined. The side surfaces 46 include a side surface 46*a* and a pair of side surfaces 46*b*. As illustrated in FIG. 7, the side surface 46*a* is a surface positioned at the end portion near the side surface 40*a* in the first cavity 44 and connects the pair of side surfaces 46*b* to each other. The side surface 46*a* extends in the direction X when viewed in the direction Z. A corner portion where the side surface 46*a* and the first bottom portion 45 intersect may have an R-shape.

The pair of side surfaces 46*b* are surfaces facing each other in the direction X. Each of the side surfaces 46*b* extends in the direction Y when viewed in the direction Z. A corner portion where each of the side surfaces 46*b* and the first bottom portion 45 intersect may have an R-shape. In addition, no side surface is provided in the end portion near the side surface 40*b* in the first cavity 44. That is, the cavity 43 opens on the side surface 40*b*. Accordingly, the optical coupling module 50 can be accommodated inside the cavity 43 through the opening. In addition, in a state where the optical coupling module 50 is accommodated in the cavity 43, the optical fibers 11 connected to the optical coupling module 50 can be drawn out to the outward side of the cavity 43 through the opening.

As illustrated in FIG. 8, the second cavity 47 is a depression provided in the first bottom portion 45 of the first cavity 44. The second cavity 47 is formed to extend in the direction X. The second cavity 47 has a smaller opening area than the first cavity 44. The opening area of the second cavity 47 is an opening area in the first bottom portion 45, and the opening area of the first cavity 44 is an opening area in the first main surface 41. The second cavity 47 has a second bottom portion 48 and side surfaces 49. The second bottom portion 48 is positioned closer to the second main surface 42 than the first bottom portion 45. In the present embodiment, the second bottom portion 48 is a surface extending in the direction X and the direction Y. When viewed in the direction Z, an outer edge of the second bottom portion 48 has a rectangular shape having long sides in the direction X. A part of the optical coupling module 50 (a part in which the lens 56 is formed) is placed in the second bottom portion 48 (refer to FIG. 5). The lens 56 is accommodated in the second cavity 47.

A plurality of penetration holes 48*a* are formed in the second bottom portion 48. In the present embodiment, two round holes and one long hole are formed as the penetration holes 48*a* for each second cavity 47. The number and the shape of the penetration holes 48*a* are not limited and may be suitably changed in accordance with the number or the shape of the optical elements 60 mounted on the second main surface 42. As illustrated in FIG. 6, the penetration hole 48*a* penetrates the second bottom portion 48 to the second main surface 42. The light L from the lens 56 toward the optical element 60 passes through the inside of the penetration hole 48*a*. The penetration hole 48*a* has a tapered shape in which the inner diameter decreases from the second bottom portion 48 toward the second main surface 42. The inner diameter and the taper angle of the penetration hole 48*a* are optimized to a size not obstructing the course of the light L. The penetration hole 48*a* may be a straight penetration hole having a constant inner diameter size.

The side surfaces 49 are surfaces connecting the second bottom portion 48 and the first bottom portion 45 to each other. The side surfaces 49 are surface rising from the outer edge of the second bottom portion 48 toward the first bottom portion 45. The side surfaces 49 define an outer edge of the second cavity 47 when viewed in the direction Z. The side surfaces 49 may be parallel to the direction Z or may be inclined. The side surfaces 49 include a pair of side surfaces 49*a* and a pair of side surfaces 49*b*. The pair of side surfaces 49*a* are surfaces facing each other in the direction Y. Each of the side surfaces 49*a* connects the pair of side surfaces 49*b*. Each of the side surfaces 49*a* extends in the direction X when viewed in the direction Z. Corner portions where each of the side surfaces 49*a* and the second bottom portion 48 intersect may have an R-shape. The pair of side surfaces 49*b* are surfaces facing each other in the direction X. Each of the side surfaces 49*b* extends in the direction Y when viewed in the direction Z. Corner portions where each of the side surfaces 49*b* and the second bottom portion 48 intersect may have an R-shape.

Figure 9:
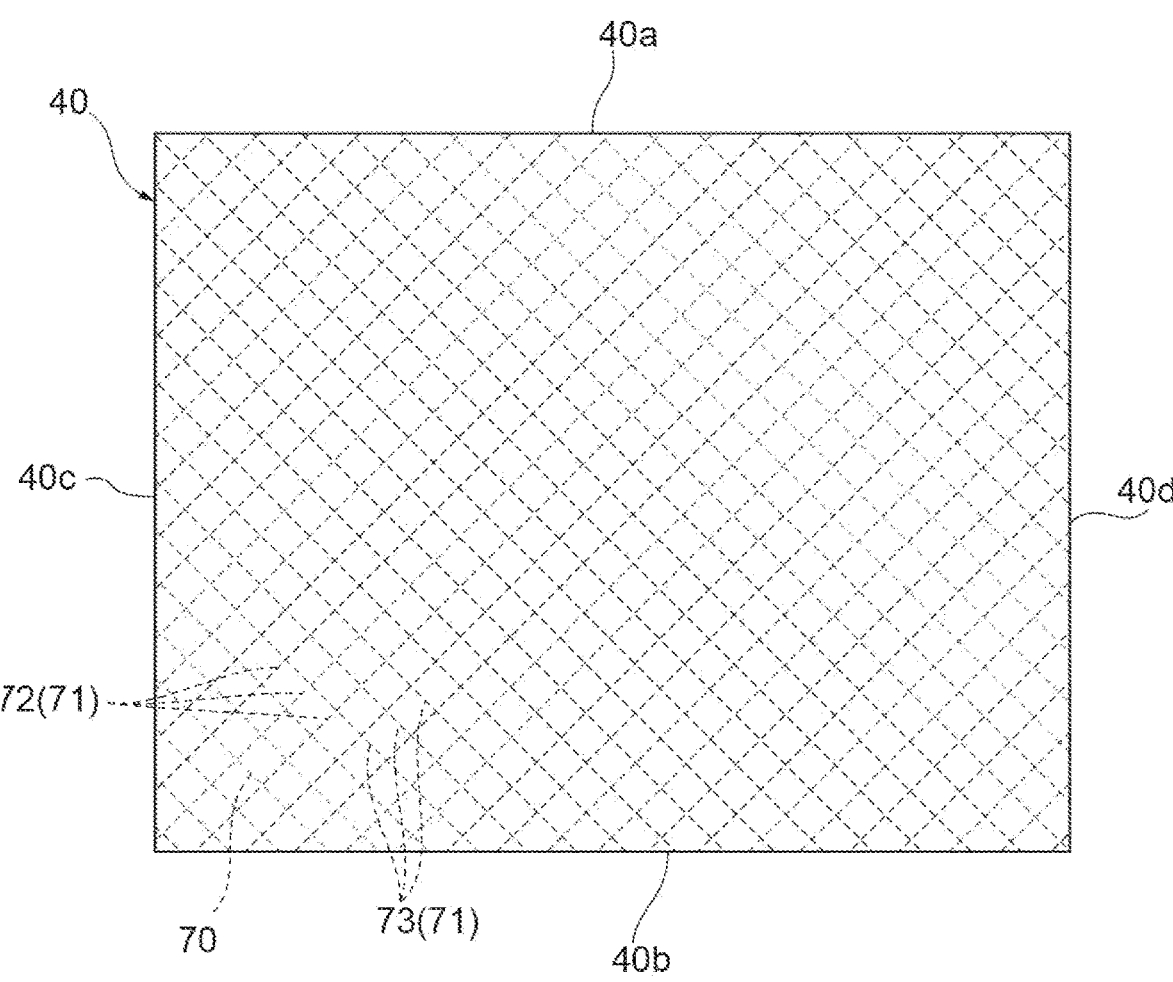
FIG. 9 is a schematic view of the substrate illustrated in FIG. 7.
Figure 9:
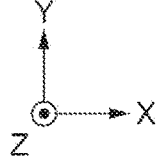

With reference to FIG. 9, details of the glass cloth 70 will be described. FIG. 9 is a schematic view of the substrate 40. FIG. 9 illustrates the substrate 40 before the plurality of cavities 43 are formed. In FIG. 9, illustration of various kinds of constitutions such as the optical elements 60 and the ICs 61 provided in the substrate 40 is omitted.

As illustrated in FIG. 9, the glass cloth 70 is provided inside the substrate 40. The glass cloth 70 is woven fabric constituted of glass threads 71 serving as weft 72 and warp 73. The glass cloth 70 has a sheet shape having meshes. In the glass cloth 70, the weft 72 and the warp 73 regularly intersect each other. The weave density of the weft 72 and the weave density of the warp 73 are equal to or more than 50 threads/25 mm and equal to or less than 100 threads/25 mm, for example. The glass threads 71 constituting the weft 72 and the warp 73 are formed of bundles of approximately several hundred (for example, equal to or more than 100 and equal to or less than 500) glass filaments, for example. The diameter of each of the glass filaments is approximately several μm (for example, equal to or more than 1 μm and equal to or less than 10 μm), for example. In FIG. 9, for the sake of convenience of description, the intervals between threads of the weft 72 and between threads of the warp 73 are illustrated larger than the actual intervals.

The weft 72 is inclined with respect to the direction X and the direction Y when viewed in the direction Z. That is, the weft 72 is inclined with respect to the side surfaces 40*a* and 40*b* and the side surfaces 40*c* and 40*d* when viewed in the direction Z. When viewed in the direction Z, an angle formed by the extension direction of the weft 72 and the side surfaces 40*a* and 40*b* (an angle that is an acute angle) may be equal to or more than 10° and equal to or less than 80°, for example, or may be equal to or more than 40° and equal to or less than 50°. In the present embodiment, the angle formed by the extension direction of the weft 72 and the side surfaces 40*a* and 40*b* is 45°. Similarly, when viewed in the direction Z, an angle formed by the extension direction of the weft 72 and the side surfaces 40*c* and 40*d* (an angle that is an acute angle) may be equal to or more than 10° and equal to or less than 80°, for example, or may be equal to or more than 40° and equal to or less than 50°. In the present embodiment, the angle formed by the extension direction of the weft 72 and the side surfaces 40*c* and 40*d* is 45°.

The warp 73 is inclined with respect to the direction X and the direction Y when viewed in the direction Z. That is, the warp 73 is inclined with respect to the side surfaces 40*a* and 40*b* and the side surfaces 40*c* and 40*d* when viewed in the direction Z. When viewed in the direction Z, an angle formed by the extension direction of the warp 73 and the side surfaces 40*a* and 40*b* (an angle that is an acute angle) may be equal to or more than 10° and equal to or less than 80°, for example, or may be equal to or more than 40° and equal to or less than 50°. In the present embodiment, the angle formed by the extension direction of the warp 73 and the side surfaces 40a and 40b is 45°. Similarly, when viewed in the direction Z, an angle formed by the extension direction of the warp 73 and the side surfaces 40c and 40d (an angle that is an acute angle) may be equal to or more than 10° and equal to or less than 80°, for example, or may be equal to or more than 40° and equal to or less than 50°. In the present embodiment, the angle formed by the extension direction of the warp 73 and the side surfaces 40c and 40d is 45°.

Figure 10:
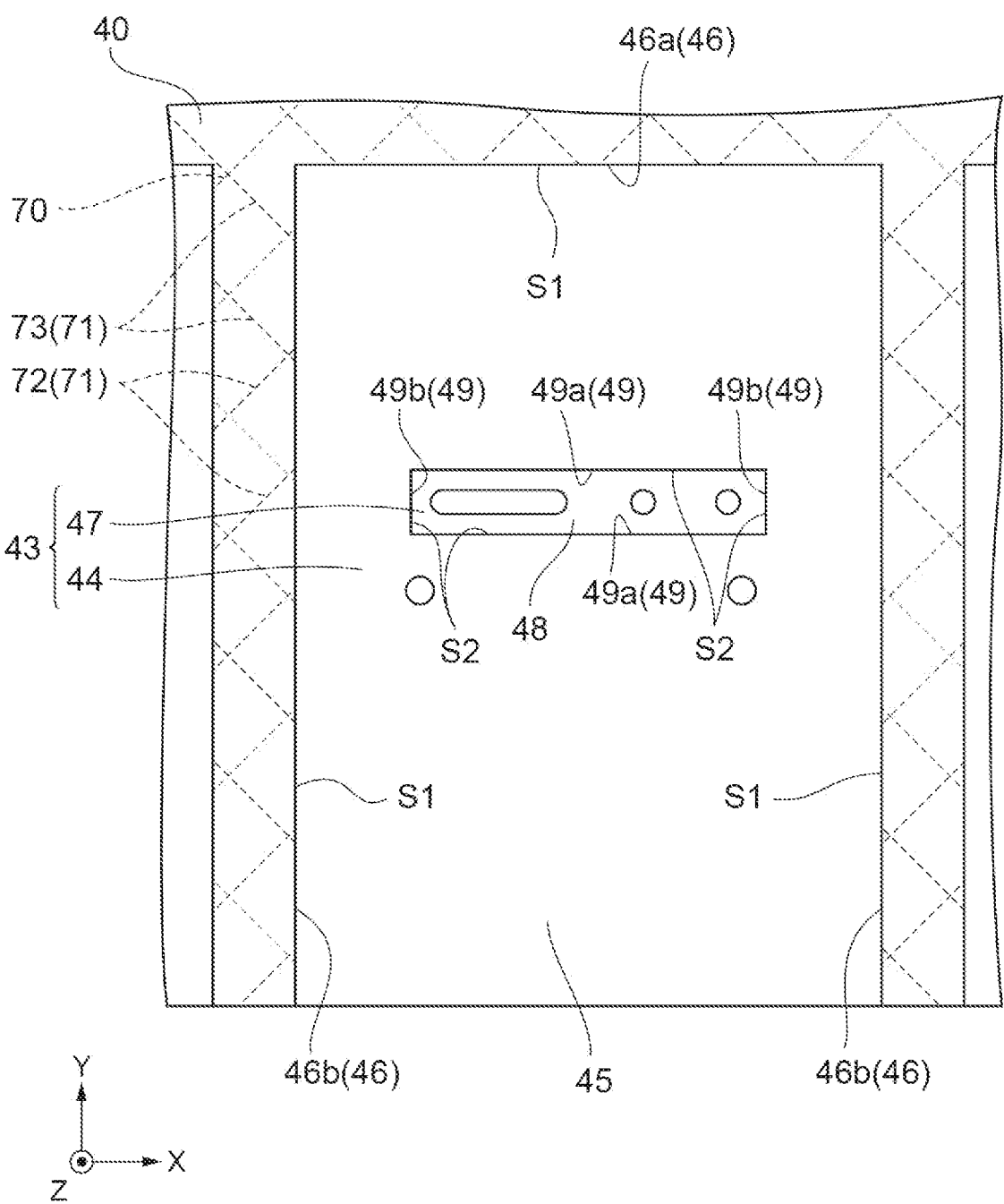
FIG. 10 is a plan view of a part in which a cavity is formed in the substrate illustrated in FIG. 7.

The cavities 43 are formed, for example, by counterboring in the substrate 40 in which the glass cloth 70 is disposed. With reference to FIG. 10, a relationship between the cavities 43 and the glass cloth 70 will be described. FIG. 10 is a plan view of a part in which the cavity 43 is formed in the substrate 40. In FIG. 10, for the sake of convenience of description, the intervals between threads of the weft 72 and between threads of the warp 73 are illustrated larger than the actual intervals. In addition, in FIG. 10, illustration of a part of the glass cloth 70 provided inside the substrate 40 and overlapping the cavity 43 is omitted. However, actually, the glass cloth 70 is also provided between the first bottom portion 45 and the second bottom portion 48, and the second main surface 42 (refer to FIG. 5).

As described above, the first cavity 44 has the side surface 46a and the pair of side surfaces 46b. The side surface 46a extends in the direction X when viewed in the direction Z. For this reason, when viewed in the direction Z, the side surface 46a is inclined with respect to the extension direction of the weft 72 and the extension direction of the warp 73. The side surfaces 46b extends in the direction Y when viewed in the direction Z. For this reason, the side surfaces 46b are inclined with respect to the extension direction of the weft 72 and the extension direction of the warp 73 when viewed in the direction Z.

The side surfaces 46 include inclined regions S1 which are inclined with respect to the extension direction of the weft 72 and the extension direction of the warp 73 when viewed in the direction Z. In the present embodiment, the entire areas of the side surface 46a and the side surfaces 46b constitute the inclined regions S1. When viewed in the direction Z, an angle formed by the inclined regions S1 and the extension direction of the weft 72 (an angle that is an acute angle) may be equal to or more than 10° and equal to or less than 80°, for example, it is 45° in the present embodiment as an example. In addition, when viewed in the direction Z, an angle formed by the inclined regions S1 and the extension direction of the warp 73 (an angle that is an acute angle) may be equal to or more than 10° and equal to or less than 80°, for example, or may be equal to or more than 40° and equal to or less than 50°. In the present embodiment, the angle formed by the inclined regions S1 and the extension direction of the warp 73 is 45°.

The second cavity 47 has the pair of side surfaces 49a and the pair of side surfaces 49b. The side surfaces 49a extend in the direction X when viewed in the direction Z. For this reason, the side surfaces 49a are inclined with respect to the extension direction of the weft 72 and the extension direction of the warp 73 when viewed in the direction Z. The side surfaces 49b extend in the direction Y when viewed in the direction Z. For this reason, the side surfaces 49b are inclined with respect to the extension direction of the weft 72 and the extension direction of the warp 73 when viewed in the direction Z.

The side surfaces 49 include inclined regions S2 which are inclined with respect to the extension direction of the weft 72 and the extension direction of the warp 73 when viewed in the direction Z. In the present embodiment, the entire areas of the side surfaces 49a and the side surfaces 49b constitute the inclined regions S2. When viewed in the direction Z, an angle formed by the inclined regions S2 and the extension direction of the weft 72 (an angle that is an acute angle) may be equal to or more than 10° and equal to or less than 80°, for example, it is 45° in the present embodiment as an example. In addition, when viewed in the direction Z, an angle formed by the inclined regions S2 and the extension direction of the warp 73 (an angle that is an acute angle) may be equal to or more than 10° and equal to or less than 80°, for example, or may be equal to or more than 40° and equal to or less than 50°. In the present embodiment, the angle formed by the inclined regions S2 and the extension direction of the warp 73 is 45°.

Figure 11:
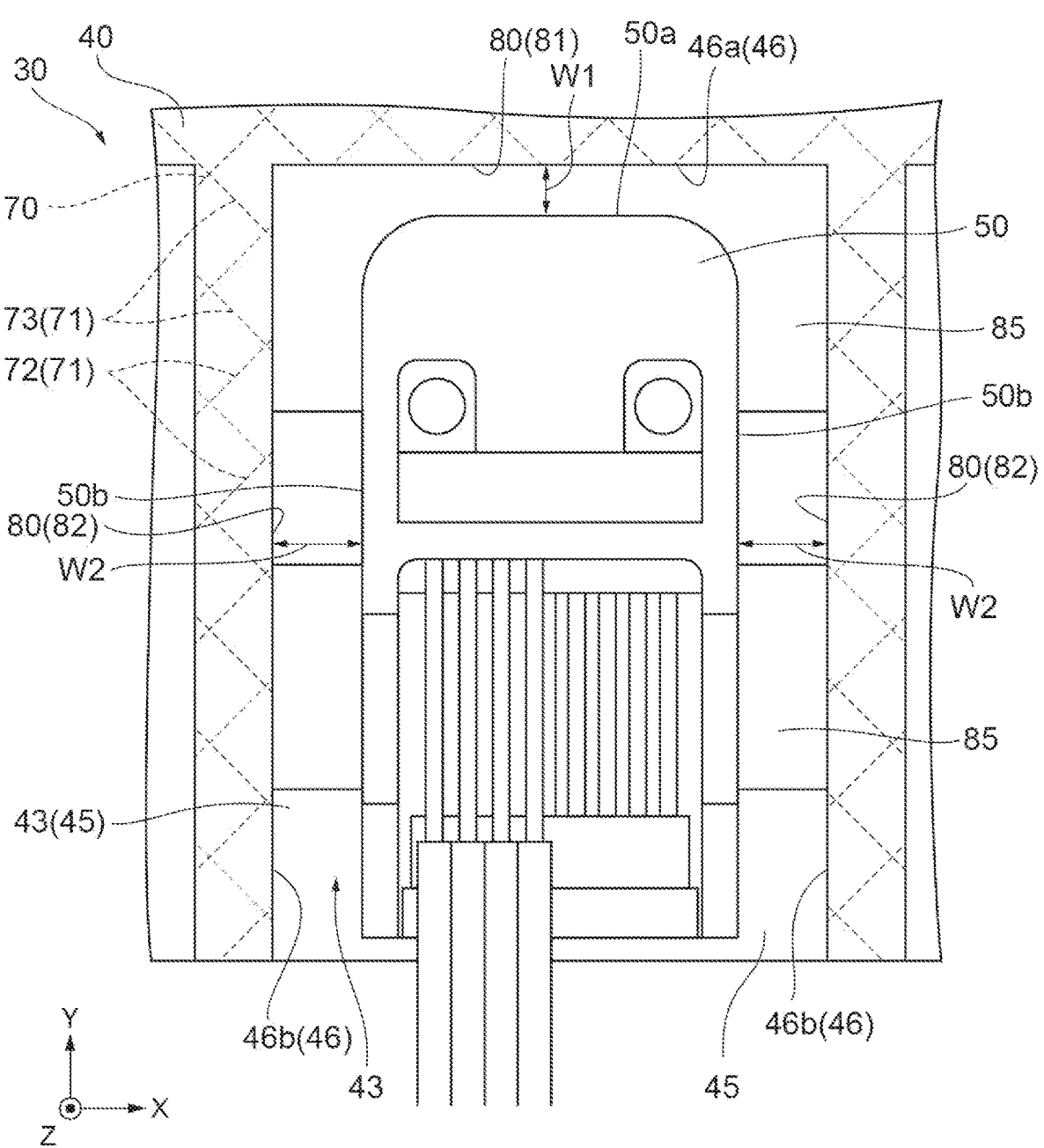
FIG. 11 is a plan view of an optical coupling module accommodated in the cavity illustrated in FIG. 7.

With reference to FIGS. 5 and 11, a form of accommodating the optical coupling module 50 in the cavity 43 will be described. FIG. 11 is a plan view of the optical coupling module 50 accommodated in the cavity 43. In FIG. 11, similarly to FIG. 10, the intervals between threads of the weft 72 and between threads of the warp 73 are illustrated larger than the actual intervals, and illustration of a part of the glass cloth 70 provided inside the substrate 40 and overlapping the first bottom portion 45 and the second bottom portion 48 is omitted.

As illustrated in FIG. 5, most of the optical coupling module 50 is accommodated in the first cavity 44, and a part in which the lens 56 is provided (a part protruding to the lower side in the direction Z) is accommodated in the second cavity 47. Parts of the optical fibers 11 positioned on the substrate 40 (attachment parts) extend along the first main surface 41 of the substrate 40. Center axes of the attachment parts are positioned inside the cavity 43. The end portions of the optical fibers 11 extend straight without causing bending on the side surface 40b of the substrate 40.

A depth D1 of the first cavity 44 is optimized in accordance with a thickness T of the optical coupling module 50, for example. Here, the depth D1 is a distance from the first main surface 41 to the first bottom portion 45 in the thickness direction (direction Z) of the substrate 40. The thickness T is a distance from the upper surface 52 to the lower surface 53 in the direction Z. The depth D1 may be a size equivalent to half or larger than the thickness T of the optical coupling module 50. In addition, in the present embodiment, the depth D1 is the size equivalent to half or larger than the thickness of the substrate 40 (a distance from the first main surface 41 to the second main surface 42). When the thickness of the substrate 40 is 10, the depth D1 may be equal to or more than 6 and equal to or less than 8, for example. As the depth D1 increases, more parts of the optical coupling module 50 are accommodated in the cavity 43, and therefore the optical module 30 becomes thinner. In the present embodiment, the upper surface 52 is positioned outside the cavity 43 (a side above the first main surface 41). However, the depth D1 may be larger such that the upper surface 52 is positioned inside the cavity 43 (at the same height as the first main surface 41 or on a side below the first main surface 41).

A depth D2 of the second cavity 47 is larger than the depth D1. Here, the depth D2 is a distance from the first main surface 41 to the second bottom portion 48 in the thickness direction of the substrate 40. When the thickness of the substrate 40 is 10, the depth D2 may be equal to or more than 7 and equal to or less than 9, for example. The depth D2 may be optimized in accordance with the thickness T of the optical coupling module 50, for example.

As illustrated in FIG. 11, in the present embodiment, the optical coupling module 50 in its entirety is disposed on the substrate 40. The optical coupling module 50 in its entirety may not be disposed on the substrate 40, and a part of the optical coupling module 50 may be disposed on the outward side of the substrate 40 (a position not overlapping the substrate 40 in the direction Z). For example, the base end part of the optical coupling module 50 (a lower part in FIG. 10) may be disposed on the outward side of the substrate 40.

The optical coupling module 50 is accommodated in the cavity 43 such that gaps 80 are provided between the side surfaces 46 and the optical coupling module 50. Specifically, a gap 81 is provided between the tip surface 50a and the side surface 46a, and gaps 82 are provided between the respective side surfaces 50b and the respective side surfaces 46b. A width W1 of the gap 81 in the direction Y may be equal to or more than 50 µm and equal to or less than 500 µm, for example. Widths W2 of the gaps 82 in the direction X may be equal to or more than 50 µm and equal to or less than 750 µm, for example. The widths W2 may be larger than the width W1.

The optical coupling module 50 is fixed to the substrate 40 using an adhesive 85. As illustrated in FIG. 5, the adhesive 85 is disposed between the lower surface 53 and the first bottom portion 45. In order to prevent the optical path of the light L from being obstructed by the adhesive 85, the adhesive 85 may not be disposed inside the second cavity 47. In addition, as illustrated in FIG. 11, the adhesive 85 is also disposed in the gap 81. The adhesive 85 is applied to the first bottom portion 45, and the optical coupling module 50 is disposed on the applied adhesive 85. Accordingly, for example, the adhesive 85 spreads due to the empty weight of the optical coupling module 50 and flows into the gaps 81 and 82. For example, the adhesive 85 is a UV curable adhesive or a light transmitting adhesive. The amount of the applied adhesive 85 per optical coupling module 50 is equal to or more than 1 mg and equal to or less than 10 mg, for example.

Hereinabove, in the optical module 30 and the optical connector cable 1 according to the present embodiment, the side surfaces 46 and 49 of the cavity 43 include the inclined regions S1 and S2. Since the inclined regions S1 and S2 are inclined with respect to the extension direction of the weft 72 and the extension direction of the warp 73 when viewed in the direction Z, the glass threads 71 are unlikely to protrude into the cavity 43 from the inclined regions S1 and S2. Therefore, compared to when the entire areas of the side surfaces 46 and 49 of the cavity 43 extend along the weft 72 or the warp 73, the amount of glass threads 71 protruding into the cavity 43 from the side surfaces 46 and 49 of the cavity 43 can be reduced. Accordingly, obstruction to accommodation of the optical coupling module 50 by the glass threads 71 protruding into the cavity 43 is curbed so that mountability of the optical coupling module 50 is improved. Moreover, presence of the glass threads 71 on the optical path (for example, between the lens 56 and the optical element 60) is curbed, and transmission of the light L is more adequately performed.

In the foregoing embodiment, when viewed in the direction Z, an angle formed by the inclined regions S1 and S2 and the extension direction of the weft 72 may be equal to or more than 10° and equal to or less than 80°. When viewed in the direction Z, an angle formed by the inclined regions S1 and S2 and the extension direction of the warp 73 may be equal to or more than 10° and equal to or less than 80°. In this case, the glass threads 71 can be more reliably prevented from protruding into the cavity 43 from the side surfaces 46 and 49 of the cavity 43. For this reason, mountability of the optical coupling module 50 is further improved, and transmission of the light L is more adequately performed.

In the foregoing embodiment, the optical coupling modules 50 respectively have groove portions 51 (holding portions) for holding the end portions of the optical fibers 11 optically coupled to the optical elements 60 via the optical coupling modules 50. In this case, since the end portions of the optical fibers 11 are adequately held by the groove portions 51 of the optical coupling modules 50, optical coupling between the optical elements 60 and the optical fibers 11 can be more accurately performed.

In the foregoing embodiment, the penetration holes 48a penetrating the second bottom portion 48 to the second main surface 42 are formed in the cavities 43. The optical elements 60 are mounted on the second main surface 42 so as to overlap the penetration holes 48a when viewed from above the second main surface 42 (in the direction Z). In this case, the optical coupling modules 50 and the optical elements 60 mounted on the second main surface 42 of the substrate 40 can be optically coupled through a simple constitution such as the penetration holes 48a.

In the foregoing embodiment, the cavities 43 have the first cavities 44 near the first main surface 41 and the second cavities 47 having the second bottom portion 48 positioned closer to the second main surface 42 than the first bottom portions 45 of the first cavities 44. In this case, the entire regions of the cavities 43 can be made smaller by making only the cavity parts (parts of the second cavities 47) mainly accommodating components such as the lenses 56 that are likely to become components protruding from the lower surfaces 53 of the optical coupling modules 50 be deep and making other parts (parts of the first cavities 44) be shallower than the cavity parts. As a result, the strength of the substrate 40 can be maintained even by a constitution in which the cavities 43 are provided in the substrate 40.

Second Embodiment

Figure 12:
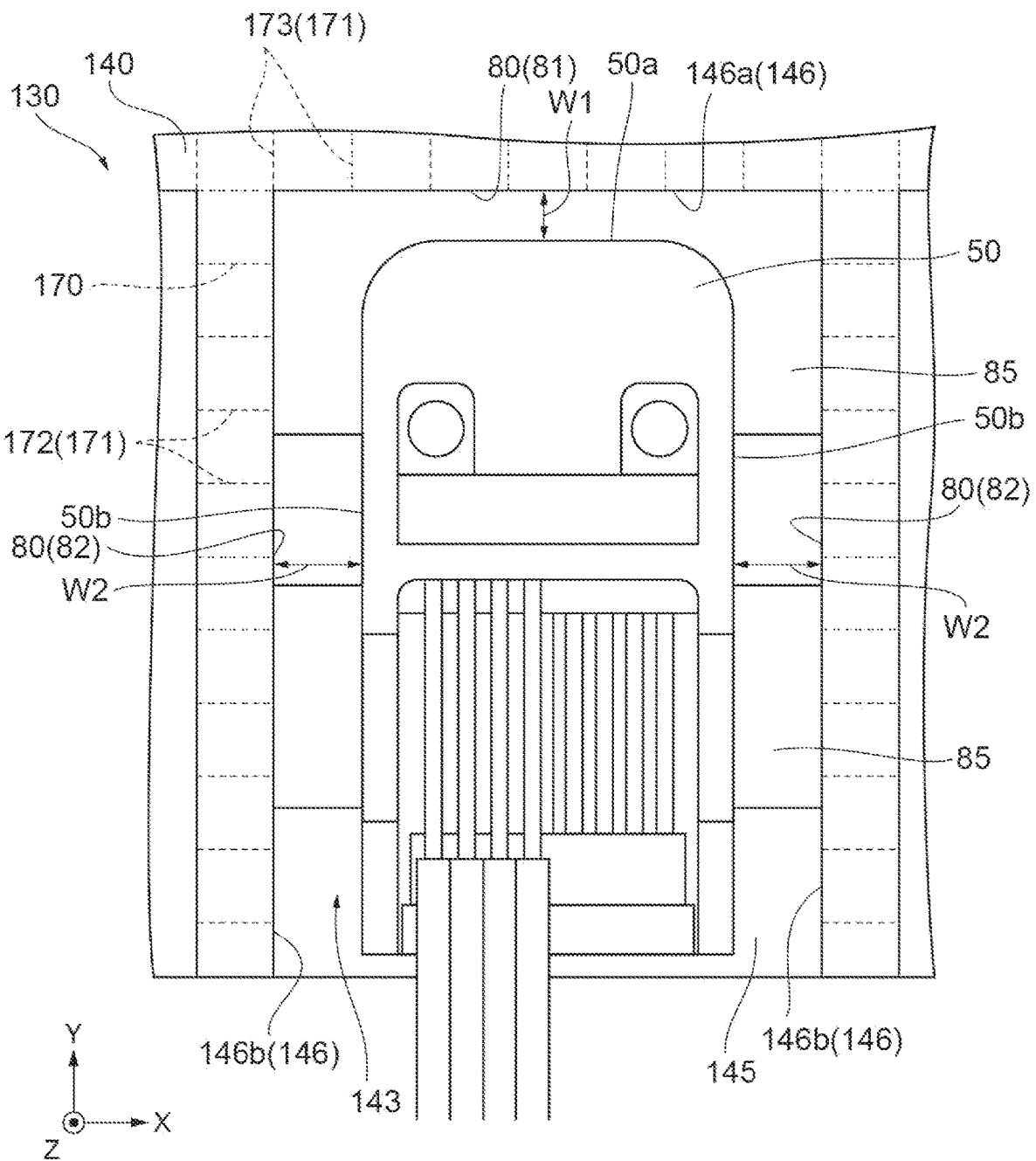
FIG. 12 is a plan view of the optical coupling module accommodated in a cavity according to a second embodiment.
Figure 13:
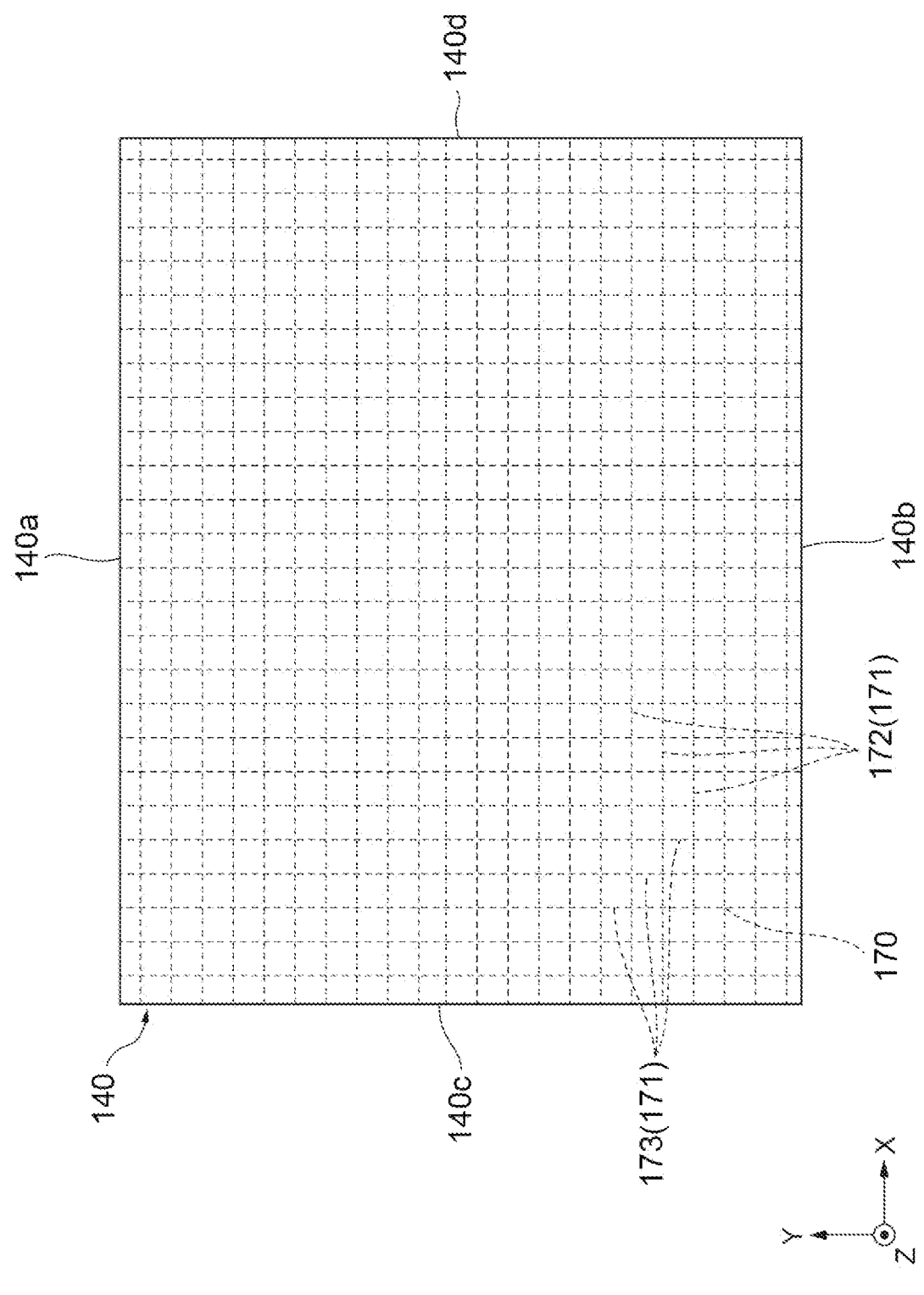
FIG. 13 is a schematic view of a substrate according to the second embodiment.
Figure 14:
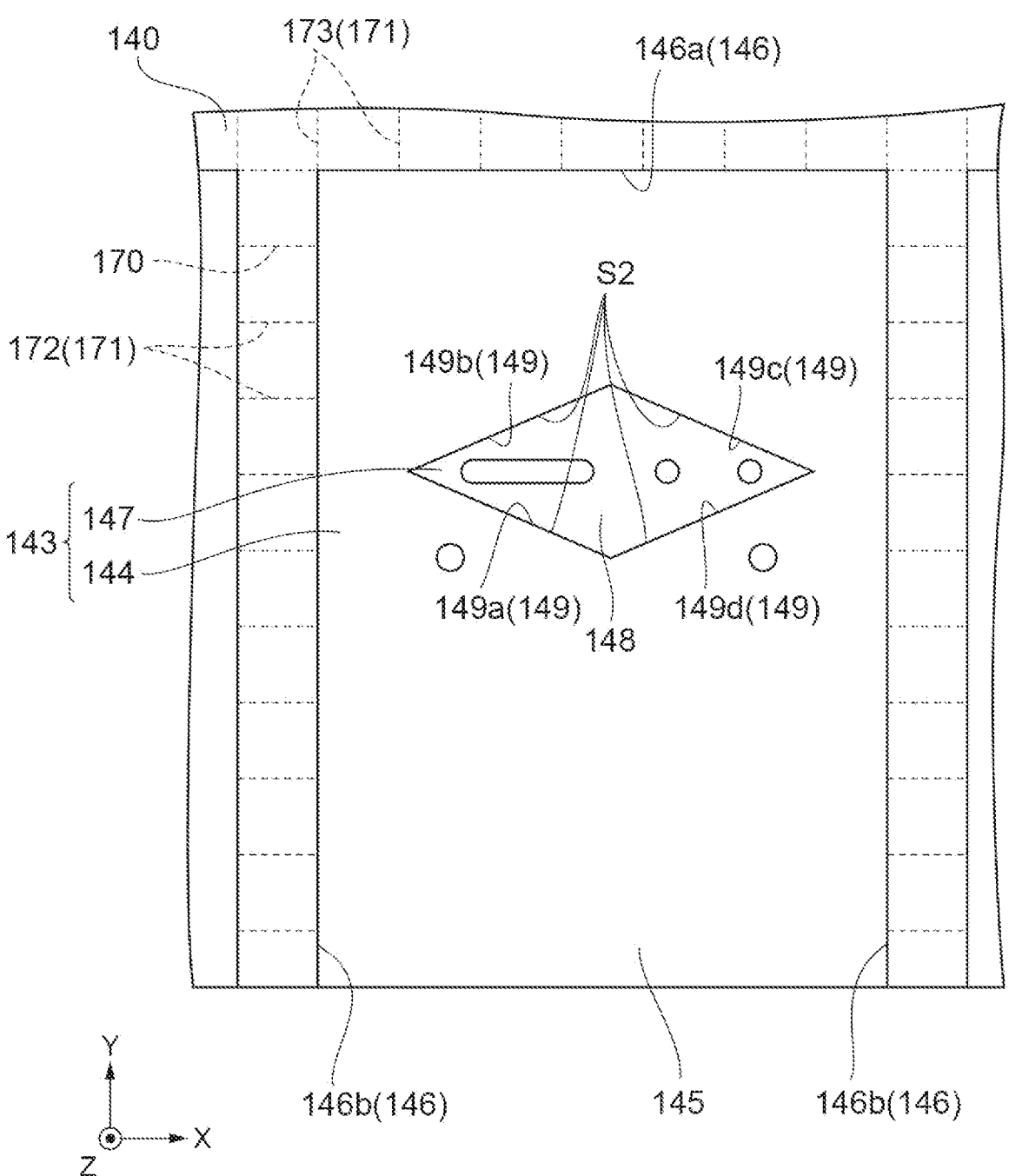
FIG. 14 is a plan view of a part in which the cavity is formed in the substrate according to the second embodiment.

An optical module 130 according to a second embodiment will be described with reference to FIGS. 12 to 14. FIG. 12 is a plan view of the optical coupling module 50 accommodated in a cavity 143 according to the second embodiment. FIG. 13 is a schematic view of a substrate 140 according to the second embodiment. FIG. 13 illustrates the substrate 140 before a plurality of cavities 143 are formed. FIG. 14 is a plan view of a part in which the cavity 143 is formed in the substrate 140 according to the second embodiment. In the following description, points different from the optical module 30 according to the first embodiment will be mainly described, and description of similar points will be omitted.

In the second embodiment, the direction of glass cloth 170 provided in the substrate 140, and the constitution of a second cavity 147 differ from those in the first embodiment. The constitution of the second embodiment is otherwise similar to that of the first embodiment. As illustrated in FIG. 13, the substrate 140 has a pair of side surfaces 140a and 140b and a pair of side surfaces 140c and 140d. When viewed in the direction Z, each of the side surfaces 140a and 140b extends in the direction X (predetermined direction). When viewed in the direction Z, each of the side surfaces 140c and 140d extends in the direction Y (a direction orthogonal to the predetermined direction). When viewed in the direction Z, an outer edge of the substrate 140 has a rectangular shape defined by the side surfaces 140a and 140b and the side surfaces 140c and 140d. The glass cloth 170 is provided inside the substrate 140.

The glass cloth 170 has weft 172 and warp 173. The weft 172 extends in the direction X. That is, when viewed in the direction Z, the weft 172 extends along the side surfaces 140a and 140b and intersects the side surfaces 140c and 140d at a right angle. The warp 173 extends in the direction Y. That is, when viewed in the direction Z, the warp 173 extends along the side surfaces 140c and 140d and intersects the side surfaces 140a and 140b at a right angle.

As illustrated in FIG. 14, the cavities 143 are formed in the substrate 140, for example, by counterboring. Similarly to the cavity 43 according to the first embodiment, the plurality of cavities 143 are formed in the substrate 140. The optical coupling module 50 is accommodated in each of the plurality of cavities 143. The cavity 143 has a first cavity 144 and the second cavity 147. The constitution of the first cavity 144 is similar to the constitution of the first cavity 44. The first cavity 144 has a first bottom portion 145 and side surfaces 146. The first bottom portion 145 is a surface where the optical coupling module 50 is placed and extends in the direction X and the direction Y in the present embodiment. The side surfaces 146 include a side surface 146a and a pair of side surfaces 146b. The side surface 146a extends in the direction X when viewed in the direction Z. The side surfaces 146b extend in the direction Y when viewed in the direction Z.

The second cavity 147 has a second bottom portion 148 and side surfaces 149. Similarly to the first embodiment, a part of the optical coupling module 50 (a part in which the lens 56 illustrated in FIG. 5 is formed) is placed in the second bottom portion 148. The second bottom portion 148 extends in the direction X and the direction Y. When viewed in the direction Z, an outer edge of the second bottom portion 148 has a rhombic shape. One symmetric axis of the rhombic shape extends in the direction X, and the other symmetric axis extends in the direction Y.

The side surfaces 149 are surfaces connecting the second bottom portion 148 and the first bottom portion 145 to each other. The side surfaces 149 are surfaces rising from the outer edge of the second bottom portion 148 toward the first bottom portion 145. The side surfaces 149 may be parallel to the direction Z or may be inclined. The side surfaces 149 include the side surfaces 149a, 149b, 149c, and 149d. When viewed in the direction Z, each of the side surfaces 149a, 149b, 149c, and 149d extends along the side of the rhombic shape exhibited by the outer edge of the second bottom portion 148. Accordingly, when viewed in the direction Z, an outer edge of the second cavity 147 has a rhombic shape defined by the side surfaces 149. When viewed in the direction Z, each of the side surfaces 149a, 149b, 149c, and 149d is inclined with respect to the direction X and the direction Y.

The side surfaces 149 of the second cavity 147 include the inclined regions S2 which are inclined with respect to the extension direction of the weft 172 (direction X) and the extension direction of the warp 173 (direction Y) when viewed in the direction Z. In the present embodiment, the entire areas of each of the side surfaces 149a, 149b, 149c, and 149d constitute the inclined regions S2. When viewed in the direction Z, an angle formed by the inclined regions S2 and the extension direction of the weft 172 may be equal to or more than 10° and equal to or less than 80°, for example, or may be equal to or more than 40° and equal to or less than 50°. In addition, when viewed in the direction Z, an angle formed by the inclined regions S2 and the extension direction of the warp 173 may be equal to or more than 10° and equal to or less than 80°, for example, or may be equal to or more than 40° and equal to or less than 50°.

Hereinabove, in the optical module 130 according to the present embodiment, the side surfaces 149 of the second cavity 147 include the inclined regions S2. Since the inclined regions S2 are inclined with respect to the extension direction of the weft 172 and the extension direction of the warp 173 of glass threads 171 when viewed in the direction Z, the glass threads 171 are unlikely to protrude into the second cavity 147 from the inclined regions S2. Therefore, compared to when the entire areas of the side surfaces 149 of the second cavity 147 extend along the weft 172 or the warp 173, the amount of glass threads 171 protruding into the second cavity 147 from the side surfaces 149 of the second cavity 147 can be reduced. Accordingly, obstruction to accommodation of the optical coupling module 50 by the glass threads 171 protruding into the second cavity 147 is curbed so that mountability of the optical coupling module 50 is improved. Moreover, presence of the glass threads 171 on the optical path (for example, between the lens 56 and the optical element 60) is curbed, and transmission of the light L is more adequately performed.

In the foregoing embodiment, when viewed in the direction Z, the outer edge of the second cavity 147 has a rhombic shape defined by the side surfaces 149. In this case, the second cavity 147 having the side surfaces 149 including the inclined regions S2 can be easily formed by a simple constitution.

First Modification Example

Figure 15:
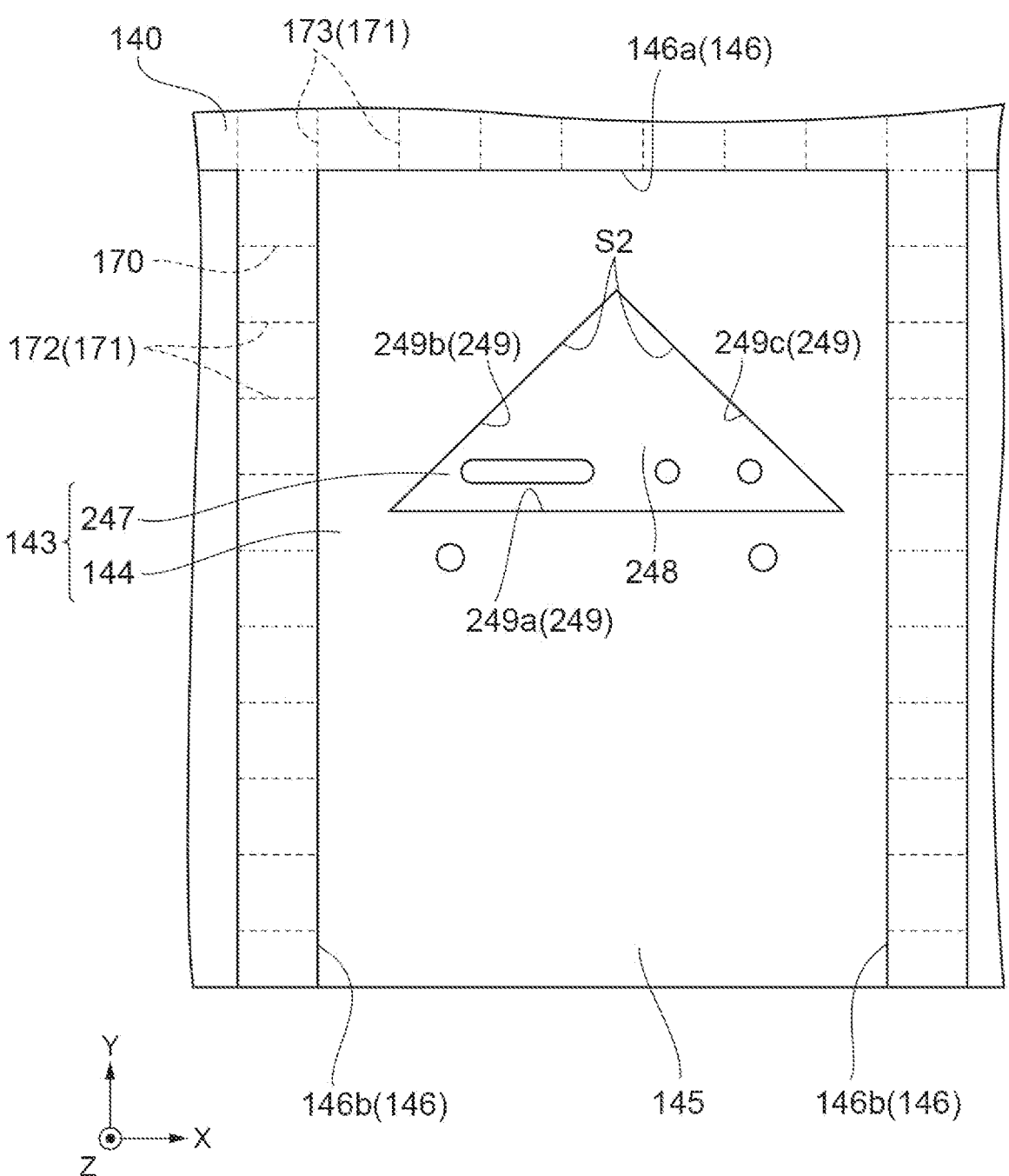
FIG. 15 is a view illustrating a second cavity according to a first modification example.

The shape of the second cavity according to the second embodiment is not limited to the shape described above. For example, as in a first modification example illustrated in FIG. 15, when viewed in the direction Z, an outer edge of a second cavity 247 may have a triangular shape defined by side surfaces 249. With reference to FIG. 15, details of the second cavity 247 according to the first modification example will be described.

The second cavity 247 has a second bottom portion 248 and the side surfaces 249. A part of the optical coupling module 50 (a part in which the lens 56 illustrated in FIG. 5 is formed) is placed in the second bottom portion 248. The second bottom portion 248 extends in the direction X and the direction Y. When viewed in the direction Z, an outer edge of the second bottom portion 248 has a triangular shape.

The side surfaces 249 are surfaces connecting the second bottom portion 248 and the first bottom portion 145 to each other. The side surfaces 249 are surfaces rising from the outer edge of the second bottom portion 248 toward the first bottom portion 145. The side surfaces 249 may be parallel to the direction Z or may be inclined. The side surfaces 249 include side surfaces 249a, 249b, and 249c. When viewed in the direction Z, each of the side surfaces 249a, 249b, and 249c extends along each side of the triangular shape exhibited by the outer edge of the second bottom portion 248. The side surface 249a extends in the direction X when viewed in the direction Z. The side surfaces 249b and 249c are inclined with respect to the direction X and the direction Y when viewed in the direction Z. That is, in the present modification example, the side surfaces 249b and 249c constitute the inclined regions S2 which are inclined with respect to the extension direction of the weft 172 and the extension direction of the warp 173.

In the present modification example as well, effects similar to the effects of the second embodiment described above are exhibited. In addition, in the present modification example, when viewed in the direction Z, an outer edge of the second cavity 247 has a triangular shape defined by the side surfaces 249. In this case, the second cavity 247 having the side surfaces 249 including the inclined regions S2 can be easily formed by a simple constitution.

Second Modification Example

Figure 16:
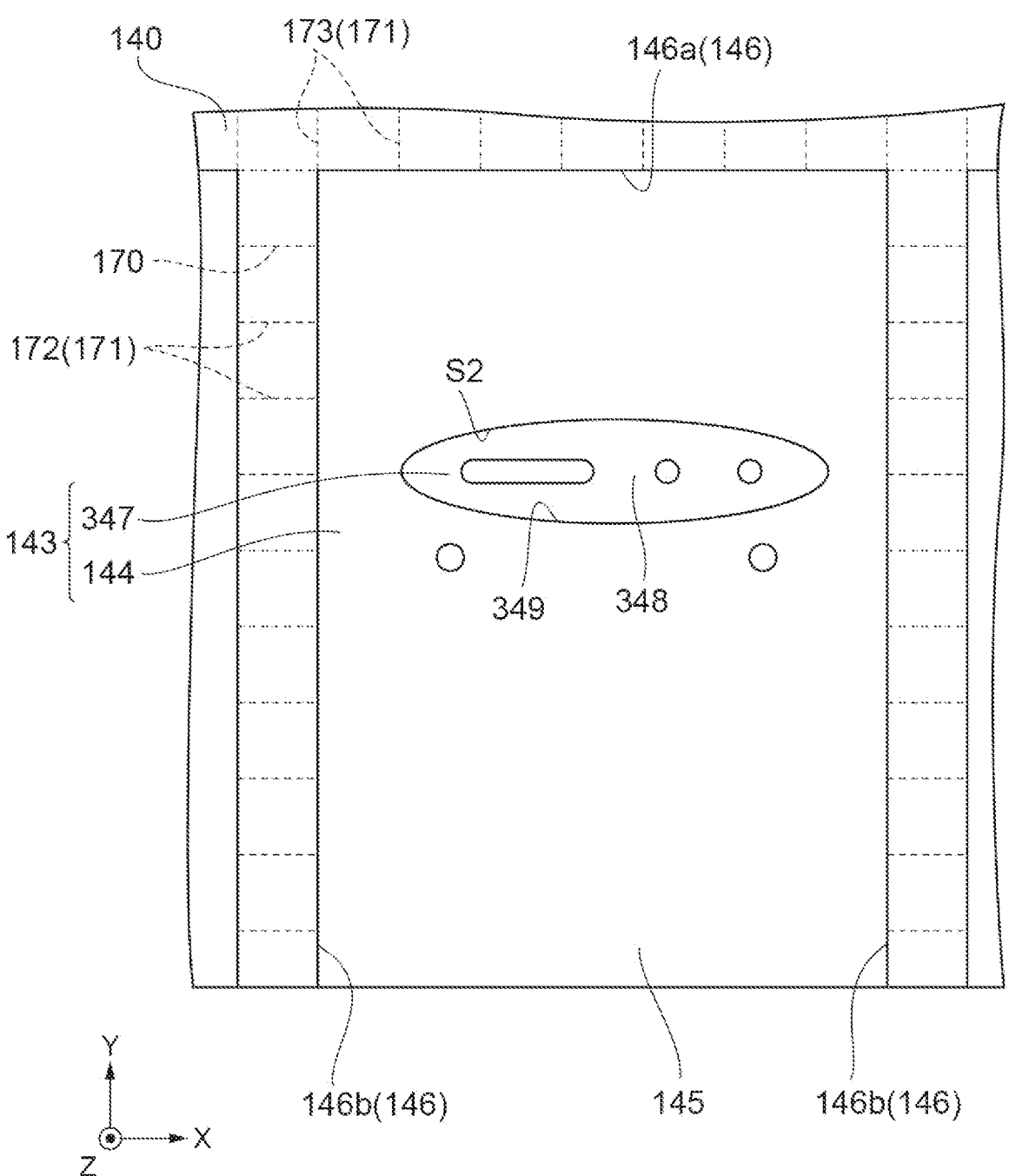
FIG. 16 is a view illustrating a second cavity according to a second modification example.

In addition, as in a second modification example illustrated in FIG. 16, when viewed in the direction Z, an outer edge of a second cavity 347 may have an oval shape defined by a side surface 349. With reference to FIG. 16, details of the second cavity 347 according to the second modification example will be described.

The second cavity 347 has a second bottom portion 348 and the side surface 349. A part of the optical coupling module 50 (a part in which the lens 56 illustrated in FIG. 5 is formed) is placed in the second bottom portion 348. The second bottom portion 348 extends in the direction X and the direction Y. When viewed in the direction Z, an outer edge of the second bottom portion 348 has an oval shape. The major axis of the oval shape extends in the direction X, and the minor axis thereof extends in the direction Y.

The side surface 349 is a surface connecting the second bottom portion 348 and the first bottom portion 145 to each other. The side surface 349 is a surface rising from the outer edge of the second bottom portion 348 toward the first bottom portion 145. The side surface 349 may be parallel to the direction Z or may be inclined. When viewed in the direction Z, the side surface 349 extends along the side of the oval shape exhibited by the outer edge of the second bottom portion 348. In the present modification example, regions on the side surface 349 inclined with respect to the direction X and the direction Y (regions excluding apex parts of the oval shape) constitute the inclined regions S2 which are inclined with respect to the extension direction of the weft 172 and the extension direction of the warp 173. The inclined regions S2 according to the present modification example are curved surfaces which are bent when viewed in the direction Z.

In the present modification example as well, effects similar to the effects of the second embodiment described above are exhibited. In addition, in the present modification example, the inclined regions S2 are curved surfaces which are bent when viewed in the direction Z. When viewed in the direction Z, an outer edge of the second cavity 347 has an oval shape defined by the side surface 349. In this case, the second cavity 347 having the side surface 349 including the inclined regions S2 can be easily formed by a simple constitution.

Third Modification Example

Figure 17:
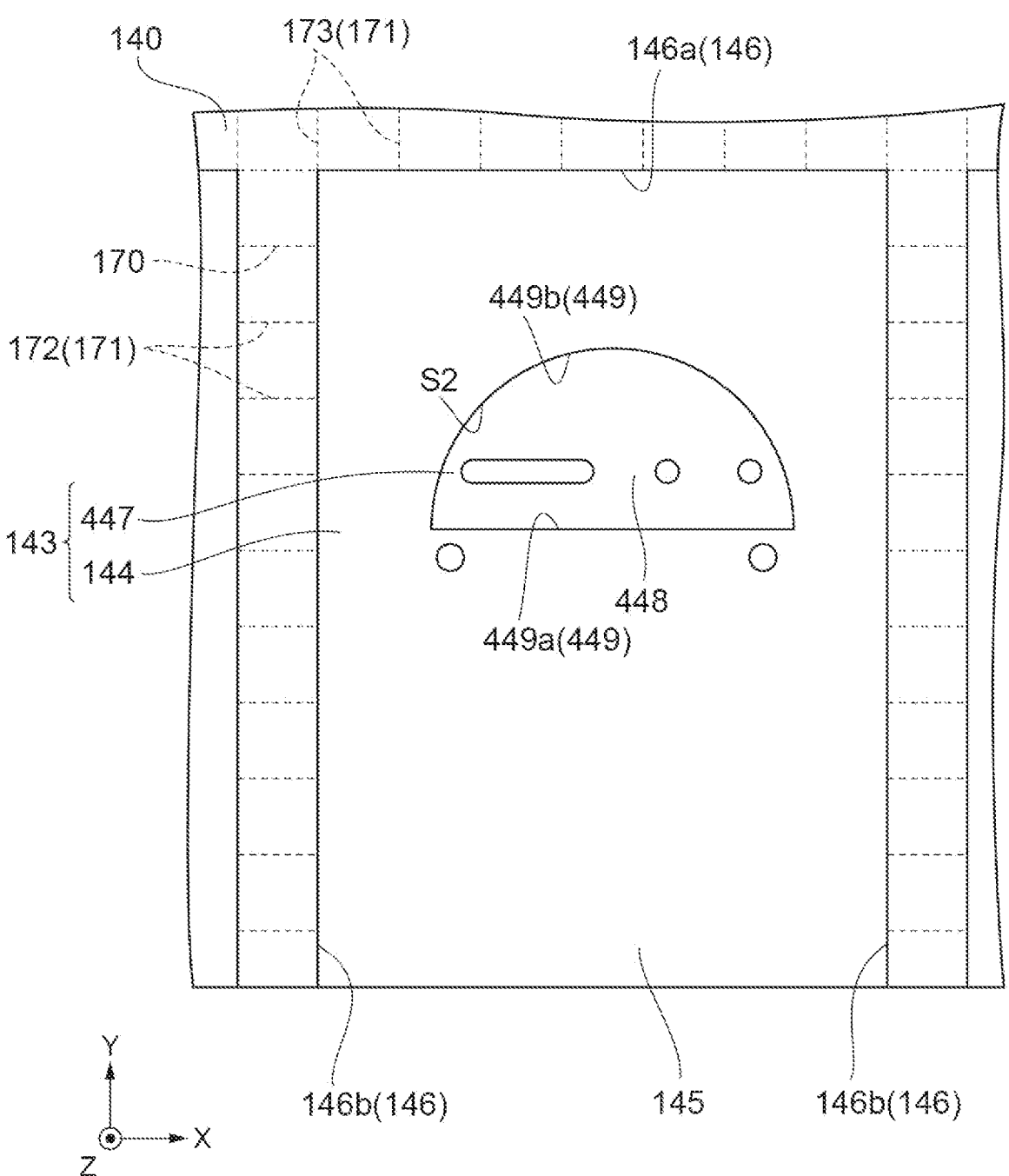
FIG. 17 is a view illustrating a second cavity according to a third modification example.

In addition, as in a third modification example illustrated in FIG. 17, when viewed in the direction Z, an outer edge of a second cavity 447 may have a fan shape defined by side surfaces 449. With reference to FIG. 17, details of the second cavity 447 according to the third modification example will be described.

The second cavity 447 has a second bottom portion 448 and the side surfaces 449. A part of the optical coupling module 50 (a part in which the lens 56 illustrated in FIG. 5 is formed) is placed in the second bottom portion 448. The second bottom portion 448 extends in the direction X and the direction Y. When viewed in the direction Z, an outer edge of the second bottom portion 448 has a fan shape.

The side surfaces 449 are surfaces connecting the second bottom portion 448 and the first bottom portion 145 to each other. The side surfaces 449 are surfaces rising from the outer edge of the second bottom portion 448 toward the first bottom portion 145. The side surfaces 449 may be parallel to the direction Z or may be inclined. When viewed in the direction Z, the side surfaces 449 extend along the side of the fan shape exhibited by the outer edge of the second bottom portion 448. The side surfaces 449 include a side surface 449a and a side surface 449b. The side surface 449a extends in the direction X when viewed in the direction Z. When viewed in the direction Z, the side surface 449b is a bent curved surface connecting both end portions of the side surface 449a in the direction X to each other. In the present modification example, regions on the side surface 449b inclined with respect to the direction X and the direction Y (regions excluding the apex part of the side surface 449b and parts intersecting the side surface 449a) constitute the inclined regions S2 which are inclined with respect to the extension direction of the weft 172 and the extension direction of the warp 173. The inclined regions S2 according to the present modification example are curved surfaces which are bent when viewed in the direction Z.

In the present modification example as well, effects similar to the effects of the second embodiment described above are exhibited. In addition, in the present modification example, the inclined regions S2 are curved surfaces which are bent when viewed in the direction Z. When viewed in the direction Z, an outer edge of the second cavity 447 has a fan shape defined by the side surfaces 449. In this case, the second cavity 447 having the side surfaces 449 including the inclined regions S2 can be easily formed by a simple constitution.

Hereinabove, the embodiments of the present disclosure have been described in detail, but the present disclosure is not limited to the foregoing embodiments and can be applied to various embodiments. For example, the optical modules 30 and 130 in the foregoing embodiments have a constitution in which the light L emitted from the optical fibers 11 is incident on the optical elements 60. However, a constitution in which light emitted from the optical elements 60 is incident on the optical fibers 11 may be adopted. At this time, the optical elements 60 may be light emitting elements such as vertical cavity surface emitting laser (VCSEL). Light emitted from the optical elements 60 may be converted into collimated light (parallel light) by the lenses 56, may be reflected by the mirrors 55, and then may be incident on the optical fibers 11.

The substrates 40 and 140 in the foregoing embodiments may be rectangular substrates having rounded corner portions. In addition, in the foregoing second embodiment, the side surfaces 146 of the first cavity 144 may include the inclined regions S1 which are inclined with respect to the extension direction of the weft 172 and the extension direction of the warp 173. In this case, an outer edge of the first cavity 144 when viewed in the thickness direction of the substrate 140 (direction Z) may have a rhombic shape, a triangular shape, an oval shape, or a fan shape defined by the side surfaces 146.

REFERENCE SIGNS LIST

1 Optical connector cable
10 Optical fiber cable
11 Optical fiber
12 Cable sheath
20 Protective member
21 Inner layer
22 Outer layer
30, 130 Optical module
40, 140 Substrate 40a, 40b, 40c, 40d, 140a, 140b, 140c, 140d Side surface
41 First main surface
41a Pattern
42 second main surface
43, 143 Cavity
43a Beam portion
44, 144 First cavity
45, 145 First bottom portion
45a Positioning hole
46, 46a, 46b, 146, 146a, 146b Side surface
47, 147, 247, 347, 447 Second cavity
48, 148, 248, 348, 448 Second bottom portion
48a Penetration hole
49, 49a, 49b, 149, 149a, 149b, 149c, 149d, 249, 249a, 249b, 249c, 349, 449, 449a, 449b Side surface
50 Optical coupling module
50a Tip surface
50b Side surface
51 Groove portion
52 Upper surface
53 Lower surface
55 Mirror
56 Lens
60 Optical element
61 IC
70, 170 Glass cloth
71, 171 Glass threads
72, 172 Weft
73, 173 Warp
80, 81, 82 Gap
85 Adhesive
F Focus
L Light
S1, S2 Inclined region
W1 Width
W2 Width

The invention claimed is:

1. An optical module comprising:
a substrate internally including a glass cloth constituted of glass threads serving as weft and warp and including an outer edge when viewed in a thickness direction of the substrate having a rectangular shape defined by a pair of first side surfaces in a predetermined direction and a pair of second side surfaces in a direction orthogonal to the predetermined direction;
an optical element mounted on the substrate; and
an optical coupling module configured to be optically coupled to the optical element,
wherein the weft is inclined with respect to the first side surfaces and the second side surfaces when viewed in the thickness direction of the substrate,
the warp is inclined with respect to the first side surfaces and the second side surfaces when viewed in the thickness direction of the substrate,
a cavity recessed from a first main surface of the substrate toward a second main surface of the substrate so as to include a bottom portion is formed in the substrate, and
at least a part of the optical coupling module is accommodated in the cavity, and
a side surface of the cavity includes an inclined region inclined with respect to an extension direction of the weft and an extension direction of the warp when viewed in the thickness direction of the substrate.

2. The optical module according to claim 1,
wherein the cavity includes a first cavity, and a second cavity including a second bottom portion positioned closer to the second main surface than a first bottom portion of the first cavity and including a smaller opening area than the first cavity.

3. The optical module according to claim 2,
wherein each of a side surface of the first cavity and a side surface of the second cavity includes the inclined region.

4. The optical module according to claim 2,
wherein the optical coupling module includes a lens optically coupled to the optical element, and
the lens is accommodated in the second cavity.

5. An optical module comprising:
a substrate internally including a glass cloth constituted of glass threads serving as weft and warp and including an outer edge when viewed in a thickness direction of the substrate having a rectangular shape defined by a pair of first side surfaces in a predetermined direction and a pair of second side surfaces in a direction orthogonal to the predetermined direction;
an optical element mounted on the substrate; and
an optical coupling module configured to be optically coupled to the optical element,
wherein the weft extends along the first side surfaces when viewed in the thickness direction of the substrate,
the warp extends along the second side surfaces when viewed in the thickness direction of the substrate,
a cavity recessed from a first main surface of the substrate toward a second main surface of the substrate so as to include a bottom portion is formed in the substrate, and
at least a part of the optical coupling module is accommodated in the cavity, and
a side surface of the cavity includes an inclined region inclined with respect to an extension direction of the weft and an extension direction of the warp when viewed in the thickness direction of the substrate.

6. The optical module according to claim 5,
wherein the cavity includes a first cavity, and a second cavity including a second bottom portion positioned closer to the second main surface than a first bottom portion of the first cavity and including a smaller opening area than the first cavity.

7. The optical module according to claim 6,
wherein a side surface of the second cavity includes the inclined region,
the optical coupling module includes a lens optically coupled to the optical element, and
the lens is accommodated in the second cavity.

8. The optical module according to claim 5,
wherein the inclined region is a curved surface bent when viewed in the thickness direction of the substrate.

9. The optical module according to claim 5,
wherein an outer edge of the cavity when viewed in the thickness direction of the substrate has an oval shape or a fan shape defined by the side surface.

10. The optical module according to claim 5,
wherein an outer edge of the cavity when viewed in the thickness direction of the substrate has a rhombic shape or a triangular shape defined by the side surface.

11. The optical module according to claim 1,
wherein an angle formed by the inclined region and the extension direction of the weft when viewed in the thickness direction of the substrate is equal to or more than 10° and equal to or less than 80°, and
an angle formed by the inclined region and the extension direction of the warp when viewed in the thickness direction of the substrate is equal to or more than 10° and equal to or less than 80°.

12. The optical module according to claim 1, wherein the optical coupling module includes a holding portion for holding end portions of optical fibers optically coupled to the optical element via the optical coupling module.

13. The optical module according to claim 1, wherein a penetration hole penetrating the bottom portion to the second main surface is formed in the cavity, and the optical element is mounted on the second main surface so as to overlap the penetration hole when viewed from above the second main surface.

14. An optical module comprising:

a substrate internally including a glass cloth constituted of glass threads serving as weft and warp and including an outer edge when viewed in a thickness direction of the substrate having a rectangular shape defined by a pair of first side surfaces in a predetermined direction and a pair of second side surfaces in a direction orthogonal to the predetermined direction;

a plurality of optical elements mounted on the substrate; and a plurality of optical coupling modules configured to be optically coupled to the plurality of respective optical elements, wherein the weft is inclined with respect to the first side surfaces and the second side surfaces when viewed in the thickness direction of the substrate, the warp is inclined with respect to the first side surfaces and the second side surfaces when viewed in the thickness direction of the substrate, a plurality of cavities recessed from a first main surface of the substrate toward a second main surface of the substrate so as to each include a bottom portion are formed in the substrate, and each of the plurality of optical coupling modules is accommodated in each of the plurality of cavities, and a side surface of each of the plurality of cavities includes an inclined region inclined with respect to an extension direction of the weft and an extension direction of the warp when viewed in the thickness direction of the substrate.

15. An optical connector cable comprising:

the optical module according to claim 1; and an optical fiber cable including at least one optical fiber, wherein the optical fiber cable is attached to the optical module such that the optical fiber is optically coupled to the optical element via the optical coupling module.

* * * * *